United States Patent
El-Zein et al.

(10) Patent No.: US 7,105,866 B2
(45) Date of Patent: Sep. 12, 2006

(54) HETEROJUNCTION TUNNELING DIODES AND PROCESS FOR FABRICATING SAME

(75) Inventors: Nada El-Zein, Phoenix, AZ (US); Jamal Ramdani, Gilbert, AZ (US); Kurt Eisenbeiser, Tempe, AZ (US); Ravindranath Droopad, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/911,624

(22) Filed: Aug. 5, 2004

(65) Prior Publication Data

US 2005/0056210 A1 Mar. 17, 2005

Related U.S. Application Data

(63) Continuation of application No. 09/624,691, filed on Jul. 24, 2000, now abandoned.

(51) Int. Cl.
*H01L 29/861* (2006.01)

(52) U.S. Cl. ............... 257/104; 257/44; 257/46; 257/51; 257/106; 257/67

(58) Field of Classification Search ............ 257/44, 257/46, 51, 52, 75, 74, 104, 106, 67
See application file for complete search history.

(56) References Cited

U.S. PATENT DOCUMENTS

| | | | |
|---|---|---|---|
| 3,617,951 A | 11/1971 | Anderson | |
| 3,670,213 A | 6/1972 | Nakawaga et al. | |
| 3,758,199 A | 9/1973 | Thaxter | |
| 3,766,370 A | 10/1973 | Walther | |
| 3,802,967 A | 4/1974 | Ladany et al. | |
| 3,818,451 A | 6/1974 | Coleman | |
| 3,914,137 A | 10/1975 | Huffman et al. | |
| 3,935,031 A | 1/1976 | Adler | |
| 4,006,989 A | 2/1977 | Andringa | |
| 4,084,130 A | 4/1978 | Holton | |
| 4,120,588 A | 10/1978 | Chaum | |
| 4,146,297 A | 3/1979 | Alferness et al. | |
| 4,174,422 A | 11/1979 | Matthews et al. | |
| 4,174,504 A | 11/1979 | Chenausky et al. | |
| 4,177,094 A | 12/1979 | Kroon | |

(Continued)

FOREIGN PATENT DOCUMENTS

DE 196 07 107 8/1997

(Continued)

OTHER PUBLICATIONS

Nakagawara et al., Effects of Buffer Layers in Epitaxial Growth of SrTiO₃ Thin Film on Si(100), *J. Appl. Phys.*, 78 (12), Dec. 15, 1995, pp. 7226-7230.

(Continued)

*Primary Examiner*—Minhloan Tran
*Assistant Examiner*—Tan Tran
(74) *Attorney, Agent, or Firm*—Oblon, Spivak, McClelland, Maier & Neustadt, P.C.

(57) ABSTRACT

High quality epitaxial layers of compound semiconductor materials can be grown overlying large silicon wafers by first growing an accommodating buffer layer on a silicon wafer. The accommodating buffer layer is a layer of monocrystalline oxide spaced apart from the silicon wafer by an amorphous interface layer of silicon oxide. The amorphous interface layer dissipates strain and permits the growth of a high quality monocrystalline oxide accommodating buffer layer. Any lattice mismatch between the accommodating buffer layer and the underlying silicon substrate is taken care of by the amorphous interface layer.

8 Claims, 7 Drawing Sheets

U.S. PATENT DOCUMENTS

| | | | |
|---|---|---|---|
| 4,242,595 A | 12/1980 | Lehovec | |
| 4,284,329 A | 8/1981 | Smith et al. | |
| 4,289,920 A | 9/1981 | Hovel | |
| 4,297,656 A | 10/1981 | Pan | |
| 4,298,247 A | 11/1981 | Michelet et al. | |
| 4,378,259 A | 3/1983 | Hasegawa et al. | |
| 4,392,297 A | 7/1983 | Little | |
| 4,398,342 A | 8/1983 | Pitt et al. | |
| 4,404,265 A | 9/1983 | Manasevit | |
| 4,424,589 A | 1/1984 | Thomas et al. | |
| 4,439,014 A | 3/1984 | Stacy et al. | |
| 4,442,590 A | 4/1984 | Stockton et al. | |
| 4,447,116 A | 5/1984 | King et al. | |
| 4,452,720 A | 6/1984 | Harada et al. | |
| 4,459,325 A | 7/1984 | Nozawa et al. | |
| 4,482,422 A | 11/1984 | McGinn et al. | |
| 4,482,906 A | 11/1984 | Hovel et al. | |
| 4,484,332 A | 11/1984 | Hawrylo | |
| 4,503,540 A | 3/1985 | Nakashima et al. | |
| 4,523,211 A | 6/1985 | Morimoto et al. | |
| 4,525,871 A | 6/1985 | Foyt et al. | |
| 4,594,000 A | 6/1986 | Falk et al. | |
| 4,626,878 A | 12/1986 | Kuwano et al. | |
| 4,629,821 A | 12/1986 | Bronstein-Bonte et al. | |
| 4,661,176 A | 4/1987 | Manasevit | |
| 4,667,088 A | 5/1987 | Kramer | |
| 4,667,212 A | 5/1987 | Nakamura | |
| 4,681,982 A | 7/1987 | Yoshida | |
| 4,695,120 A | 9/1987 | Holder | |
| 4,723,321 A | 2/1988 | Saleh | |
| 4,748,485 A | 5/1988 | Vasudev | |
| 4,756,007 A | 7/1988 | Qureshi et al. | |
| 4,772,929 A | 9/1988 | Manchester et al. | |
| 4,773,063 A | 9/1988 | Hunsperger et al. | |
| 4,774,205 A | 9/1988 | Choi et al. | |
| 4,777,613 A | 10/1988 | Shahan et al. | |
| 4,793,872 A | 12/1988 | Meunier et al. | |
| 4,801,184 A | 1/1989 | Revelli | |
| 4,802,182 A | 1/1989 | Thornton et al. | |
| 4,804,866 A | 2/1989 | Akiyama | |
| 4,815,084 A | 3/1989 | Scifres et al. | |
| 4,841,775 A | 6/1989 | Ikeda et al. | |
| 4,843,609 A | 6/1989 | Ohya et al. | |
| 4,845,044 A * | 7/1989 | Ariyoshi et al. | 438/480 |
| 4,846,926 A | 7/1989 | Kay et al. | |
| 4,855,249 A | 8/1989 | Akasaki et al. | |
| 4,866,489 A | 9/1989 | Yokogawa et al. | |
| 4,868,376 A | 9/1989 | Lessin et al. | |
| 4,872,046 A | 10/1989 | Morkoc et al. | |
| 4,876,208 A | 10/1989 | Gustafson et al. | |
| 4,876,218 A | 10/1989 | Pessa et al. | |
| 4,876,219 A | 10/1989 | Eshita et al. | |
| 4,882,300 A | 11/1989 | Inoue et al. | |
| 4,885,376 A | 12/1989 | Verkade | |
| 4,888,202 A | 12/1989 | Murakami et al. | |
| 4,889,402 A | 12/1989 | Reinhart | |
| 4,891,091 A | 1/1990 | Shastry | |
| 4,896,194 A | 1/1990 | Suzuki | |
| 4,901,133 A | 2/1990 | Curran et al. | |
| 4,910,164 A | 3/1990 | Shichijo | |
| 4,912,087 A | 3/1990 | Aslam et al. | |
| 4,928,154 A | 5/1990 | Umeno et al. | |
| 4,934,777 A | 6/1990 | Jou et al. | |
| 4,952,420 A | 8/1990 | Walters | |
| 4,959,702 A | 9/1990 | Moyer et al. | |
| 4,963,508 A | 10/1990 | Umeno et al. | |
| 4,963,949 A | 10/1990 | Wanlass et al. | |
| 4,965,649 A | 10/1990 | Zanio et al. | |
| 4,981,714 A | 1/1991 | Ohno et al. | |
| 4,984,043 A | 1/1991 | Vinal | |
| 4,999,842 A | 3/1991 | Huang et al. | |
| 5,018,816 A | 5/1991 | Murray et al. | |
| 5,028,563 A | 7/1991 | Feit et al. | |
| 5,028,976 A | 7/1991 | Ozaki et al. | |
| 5,051,790 A | 9/1991 | Hammer | |
| 5,053,835 A | 10/1991 | Horikawa et al. | |
| 5,055,445 A | 10/1991 | Belt et al. | |
| 5,055,835 A | 10/1991 | Sutton | |
| 5,057,694 A | 10/1991 | Idaka et al. | |
| 5,060,031 A | 10/1991 | Abrokwah et al. | |
| 5,063,081 A | 11/1991 | Cozzette et al. | |
| 5,063,166 A | 11/1991 | Mooney et al. | |
| 5,064,781 A | 11/1991 | Cambou et al. | |
| 5,067,809 A | 11/1991 | Tsubota | |
| 5,073,981 A | 12/1991 | Giles et al. | |
| 5,075,743 A | 12/1991 | Behfar-Rad | |
| 5,081,062 A * | 1/1992 | Vasudev et al. | 438/412 |
| 5,081,519 A | 1/1992 | Nishimura et al. | |
| 5,087,829 A | 2/1992 | Ishibashi et al. | |
| 5,103,494 A | 4/1992 | Mozer | |
| 5,116,461 A | 5/1992 | Lebby et al. | |
| 5,119,448 A | 6/1992 | Schaefer et al. | |
| 5,122,679 A | 6/1992 | Ishii et al. | |
| 5,122,852 A | 6/1992 | Chan et al. | |
| 5,127,067 A | 6/1992 | Delcoco et al. | |
| 5,130,762 A | 7/1992 | Kulick | |
| 5,132,648 A | 7/1992 | Trinh et al. | |
| 5,140,387 A | 8/1992 | Okazaki et al. | |
| 5,140,651 A | 8/1992 | Soref et al. | |
| 5,141,894 A | 8/1992 | Bisaro et al. | |
| 5,143,854 A | 9/1992 | Pirrung et al. | |
| 5,144,409 A | 9/1992 | Ma | |
| 5,148,504 A | 9/1992 | Levi et al. | |
| 5,155,658 A | 10/1992 | Inam et al. | |
| 5,159,413 A | 10/1992 | Calviello et al. | |
| 5,163,118 A | 11/1992 | Lorenzo et al. | |
| 5,166,761 A | 11/1992 | Olson et al. | |
| 5,173,474 A | 12/1992 | Connell et al. | |
| 5,173,835 A | 12/1992 | Cornett et al. | |
| 5,181,085 A | 1/1993 | Moon et al. | |
| 5,185,589 A | 2/1993 | Krishnaswamy et al. | |
| 5,188,976 A | 2/1993 | Kume et al. | |
| 5,191,625 A | 3/1993 | Gustavsson | |
| 5,194,397 A | 3/1993 | Cook et al. | |
| 5,194,917 A | 3/1993 | Regener | |
| 5,198,269 A | 3/1993 | Swartz et al. | |
| 5,208,182 A | 5/1993 | Narayan et al. | |
| 5,210,763 A | 5/1993 | Lewis et al. | |
| 5,216,359 A | 6/1993 | Makki et al. | |
| 5,216,729 A | 6/1993 | Berger et al. | |
| 5,221,367 A | 6/1993 | Chisholm et al. | |
| 5,225,031 A | 7/1993 | McKee et al. | |
| 5,227,196 A | 7/1993 | Itoh | |
| 5,238,877 A | 8/1993 | Russell | |
| 5,244,818 A | 9/1993 | Jokers et al. | |
| 5,248,564 A | 9/1993 | Ramesh | |
| 5,260,394 A | 11/1993 | Tazaki et al. | |
| 5,262,659 A | 11/1993 | Grudkowski et al. | |
| 5,266,355 A | 11/1993 | Wernberg et al. | |
| 5,268,327 A | 12/1993 | Vernon | |
| 5,270,298 A | 12/1993 | Ramesh | |
| 5,280,013 A | 1/1994 | Newman et al. | |
| 5,281,834 A | 1/1994 | Cambou et al. | |
| 5,283,462 A | 2/1994 | Stengel | |
| 5,286,985 A | 2/1994 | Taddiken | |
| 5,293,050 A | 3/1994 | Chapple-Sokol et al. | |
| 5,306,649 A | 4/1994 | Hebert | |
| 5,310,707 A | 5/1994 | Oishi et al. | |
| 5,312,765 A | 5/1994 | Kanber | |
| 5,313,058 A | 5/1994 | Friederich et al. | |
| 5,314,547 A | 5/1994 | Heremans et al. | |
| 5,315,128 A | 5/1994 | Hunt et al. | |
| 5,323,023 A | 6/1994 | Fork | |
| 5,326,721 A | 7/1994 | Summerfelt | |

| | | | | | |
|---|---|---|---|---|---|
| 5,334,556 A | 8/1994 | Guldi | 5,540,785 A | 7/1996 | Dennard et al. |
| 5,352,926 A | 10/1994 | Andrews | 5,541,422 A | 7/1996 | Wolf et al. |
| 5,356,509 A | 10/1994 | Terranova et al. | 5,548,141 A | 8/1996 | Morris et al. |
| 5,356,831 A | 10/1994 | Calviello et al. | 5,549,977 A | 8/1996 | Jin et al. |
| 5,357,122 A | 10/1994 | Okubora et al. | 5,551,238 A | 9/1996 | Prueitt |
| 5,358,925 A | 10/1994 | Neville Connell et al. | 5,552,547 A | 9/1996 | Shi |
| 5,362,972 A | 11/1994 | Yazawa et al. | 5,553,089 A | 9/1996 | Seki et al. |
| 5,362,998 A | 11/1994 | Iwamura et al. | 5,556,463 A | 9/1996 | Guenzer |
| 5,365,477 A | 11/1994 | Cooper, Jr. et al. | 5,559,368 A | 9/1996 | Hu et al. |
| 5,371,621 A | 12/1994 | Stevens | 5,561,305 A | 10/1996 | Smith |
| 5,371,734 A | 12/1994 | Fischer | 5,569,953 A | 10/1996 | Kikkawa et al. |
| 5,372,992 A | 12/1994 | Itozaki et al. | 5,570,226 A | 10/1996 | Ota |
| 5,373,166 A | 12/1994 | Buchan et al. | 5,572,052 A | 11/1996 | Kashihara et al. |
| 5,387,811 A | 2/1995 | Saigoh | 5,574,296 A | 11/1996 | Park et al. |
| 5,391,515 A | 2/1995 | Kao et al. | 5,574,589 A | 11/1996 | Feuer et al. |
| 5,393,352 A | 2/1995 | Summerfelt | 5,574,744 A | 11/1996 | Gaw et al. |
| 5,394,489 A | 2/1995 | Koch | 5,576,879 A | 11/1996 | Nashimoto |
| 5,395,663 A | 3/1995 | Tabata et al. | 5,578,162 A | 11/1996 | D'Asaro et al. |
| 5,397,428 A | 3/1995 | Stoner et al. | 5,585,167 A | 12/1996 | Satoh et al. |
| 5,399,898 A | 3/1995 | Rostoker | 5,585,288 A | 12/1996 | Davis et al. |
| 5,404,581 A | 4/1995 | Honjo | 5,588,995 A | 12/1996 | Sheldon |
| 5,405,802 A | 4/1995 | Yamagata et al. | 5,589,284 A | 12/1996 | Summerfelt et al. |
| 5,406,202 A | 4/1995 | Mehrgardt et al. | 5,596,205 A | 1/1997 | Reedy et al. |
| 5,410,622 A | 4/1995 | Okada et al. | 5,596,214 A | 1/1997 | Endo |
| 5,418,216 A | 5/1995 | Fork | 5,602,418 A | 2/1997 | Imai et al. |
| 5,418,389 A | 5/1995 | Watanabe | 5,603,764 A | 2/1997 | Matsuda et al. |
| 5,420,102 A | 5/1995 | Harshavardhan et al. | 5,606,184 A | 2/1997 | Abrokwah et al. |
| 5,427,988 A | 6/1995 | Sengupta et al. | 5,608,046 A | 3/1997 | Cook et al. |
| 5,430,397 A | 7/1995 | Itoh et al. | 5,610,744 A | 3/1997 | Ho et al. |
| 5,436,759 A | 7/1995 | Dijaii et al. | 5,614,739 A | 3/1997 | Abrokwah et al. |
| 5,438,584 A | 8/1995 | Paoli et al. | 5,619,051 A | 4/1997 | Endo |
| 5,441,577 A | 8/1995 | Sasaki et al. | 5,621,227 A | 4/1997 | Joshi |
| 5,442,191 A | 8/1995 | Ma | 5,623,439 A | 4/1997 | Gotoh et al. |
| 5,442,561 A | 8/1995 | Yoshizawa et al. | 5,623,552 A | 4/1997 | Lane |
| 5,444,016 A | 8/1995 | Abrokwah et al. | 5,629,534 A | 5/1997 | Inuzuka et al. |
| 5,446,719 A | 8/1995 | Yoshida et al. | 5,633,724 A | 5/1997 | King et al. |
| 5,450,812 A | 9/1995 | McKee et al. | 5,635,433 A | 6/1997 | Sengupta |
| 5,452,118 A | 9/1995 | Maruska | 5,635,453 A | 6/1997 | Pique et al. |
| 5,453,727 A | 9/1995 | Shibasaki et al. | 5,640,267 A | 6/1997 | May et al. |
| 5,466,631 A | 11/1995 | Ichikawa et al. | 5,642,371 A | 6/1997 | Tohyama et al. |
| 5,473,047 A | 12/1995 | Shi | 5,650,646 A | 7/1997 | Summerfelt |
| 5,473,171 A | 12/1995 | Summerfelt | 5,656,382 A | 8/1997 | Nashimoto |
| 5,477,363 A | 12/1995 | Matsuda | 5,659,180 A | 8/1997 | Shen et al. |
| 5,478,653 A | 12/1995 | Guenzer | 5,661,112 A | 8/1997 | Hatta et al. |
| 5,479,033 A | 12/1995 | Baca et al. | 5,666,376 A | 9/1997 | Cheng |
| 5,479,317 A | 12/1995 | Ramesh | 5,667,586 A | 9/1997 | Ek et al. |
| 5,480,829 A | 1/1996 | Abrokwah et al. | 5,668,048 A | 9/1997 | Kondo et al. |
| 5,481,102 A | 1/1996 | Hazelrigg, Jr. | 5,670,798 A | 9/1997 | Schetzina |
| 5,482,003 A | 1/1996 | McKee et al. | 5,670,800 A | 9/1997 | Nakao et al. |
| 5,484,664 A | 1/1996 | Kitahara et al. | 5,674,366 A | 10/1997 | Hayashi et al. |
| 5,486,406 A | 1/1996 | Shi | 5,674,813 A | 10/1997 | Nakamura et al. |
| 5,491,461 A | 2/1996 | Partin et al. | 5,679,947 A | 10/1997 | Doi et al. |
| 5,492,859 A | 2/1996 | Sakaguchi et al. | 5,679,965 A | 10/1997 | Schetzina |
| 5,494,711 A | 2/1996 | Takeda et al. | 5,682,046 A | 10/1997 | Takahashi et al. |
| 5,504,035 A | 4/1996 | Rostoker et al. | 5,684,302 A | 11/1997 | Wersing et al. |
| 5,504,183 A | 4/1996 | Shi | 5,686,741 A | 11/1997 | Ohori et al. |
| 5,508,554 A | 4/1996 | Takatani et al. | 5,689,123 A | 11/1997 | Major et al. |
| 5,510,665 A | 4/1996 | Conley | 5,693,140 A | 12/1997 | McKee et al. |
| 5,511,238 A | 4/1996 | Bayraktaroglu | 5,696,392 A | 12/1997 | Char et al. |
| 5,512,773 A | 4/1996 | Wolf et al. | 5,719,417 A | 2/1998 | Roeder et al. |
| 5,514,484 A | 5/1996 | Nashimoto | 5,725,641 A | 3/1998 | MacLeod |
| 5,514,904 A | 5/1996 | Onga et al. | 5,729,394 A | 3/1998 | Sevier et al. |
| 5,515,047 A | 5/1996 | Yamakido et al. | 5,729,641 A | 3/1998 | Chandonnet et al. |
| 5,515,810 A | 5/1996 | Yamashita et al. | 5,731,220 A | 3/1998 | Tsu et al. |
| 5,516,725 A | 5/1996 | Chang et al. | 5,733,641 A | 3/1998 | Fork et al. |
| 5,519,235 A | 5/1996 | Ramesh | 5,734,672 A | 3/1998 | McMinn et al. |
| 5,523,602 A | 6/1996 | Horiuchi et al. | 5,735,949 A | 4/1998 | Mantl et al. |
| 5,528,057 A | 6/1996 | Yanagase et al. | 5,741,724 A | 4/1998 | Ramdani et al. |
| 5,528,067 A | 6/1996 | Farb et al. | 5,745,631 A | 4/1998 | Reinker |
| 5,528,209 A | 6/1996 | Macdonald et al. | 5,753,300 A | 5/1998 | Wessels et al. |
| 5,528,414 A | 6/1996 | Oakley | 5,753,928 A | 5/1998 | Krause |
| 5,530,235 A | 6/1996 | Stefik et al. | 5,753,934 A | 5/1998 | Yano et al. |
| 5,538,941 A | 7/1996 | Findikoglu et al. | 5,754,319 A | 5/1998 | Van De Voorde et al. |

| | | | | | |
|---|---|---|---|---|---|
| 5,754,714 A | 5/1998 | Suzuki et al. | 5,959,879 A | 9/1999 | Koo |
| 5,760,426 A | 6/1998 | Marx et al. | 5,962,069 A | 10/1999 | Schindler et al. |
| 5,760,427 A | 6/1998 | Onda | 5,963,291 A | 10/1999 | Wu et al. |
| 5,760,740 A | 6/1998 | Blodgett | 5,966,323 A | 10/1999 | Chen et al. |
| 5,764,676 A | 6/1998 | Paoli et al. | 5,976,953 A | 11/1999 | Zavracky et al. |
| 5,767,543 A | 6/1998 | Ooms et al. | 5,977,567 A | 11/1999 | Verdiell |
| 5,770,887 A | 6/1998 | Tadatomo et al. | 5,981,400 A | 11/1999 | Lo |
| 5,772,758 A | 6/1998 | Collins et al. | 5,981,976 A | 11/1999 | Murasato |
| 5,776,359 A | 7/1998 | Schultz et al. | 5,981,980 A | 11/1999 | Miyajima et al. |
| 5,776,621 A | 7/1998 | Nashimoto | 5,984,190 A | 11/1999 | Nevill |
| 5,777,350 A | 7/1998 | Nakamura et al. | 5,985,404 A | 11/1999 | Yano et al. |
| 5,777,762 A | 7/1998 | Yamamoto | 5,986,301 A | 11/1999 | Fukushima et al. |
| 5,778,018 A | 7/1998 | Yoshikawa et al. | 5,987,011 A | 11/1999 | Toh |
| 5,778,116 A | 7/1998 | Tomich | 5,987,196 A | 11/1999 | Noble |
| 5,780,311 A | 7/1998 | Beasom et al. | 5,990,495 A | 11/1999 | Ohba |
| 5,789,733 A | 8/1998 | Jachimowicz et al. | 5,995,359 A | 11/1999 | Klee et al. |
| 5,789,845 A | 8/1998 | Wadaka et al. | 5,995,528 A | 11/1999 | Fukunaga et al. |
| 5,790,583 A | 8/1998 | Ho | 5,997,638 A | 12/1999 | Copel et al. |
| 5,792,569 A | 8/1998 | Sun et al. | 5,998,781 A | 12/1999 | Vawter et al. |
| 5,792,679 A | 8/1998 | Nakato | 5,998,819 A | 12/1999 | Yokoyama et al. |
| 5,796,648 A | 8/1998 | Kawakubo et al. | 6,002,375 A | 12/1999 | Corman et al. |
| 5,801,072 A | 9/1998 | Barber | 6,008,762 A | 12/1999 | Nghiem |
| 5,801,105 A | 9/1998 | Yano et al. | 6,011,641 A | 1/2000 | Shin et al. |
| 5,807,440 A | 9/1998 | Kubota et al. | 6,011,646 A | 1/2000 | Mirkarimi et al. |
| 5,810,923 A | 9/1998 | Yano et al. | 6,013,553 A | 1/2000 | Wallace et al. |
| 5,812,272 A | 9/1998 | King et al. | 6,020,222 A | 2/2000 | Wollesen |
| 5,814,583 A | 9/1998 | Itozaki et al. | 6,022,140 A | 2/2000 | Fraden et al. |
| 5,825,055 A | 10/1998 | Summerfelt | 6,022,410 A | 2/2000 | Yu et al. |
| 5,825,799 A | 10/1998 | Ho et al. | 6,022,671 A | 2/2000 | Binkley et al. |
| 5,827,755 A | 10/1998 | Yonehara et al. | 6,022,963 A | 2/2000 | McGall et al. |
| 5,828,080 A | 10/1998 | Yano et al. | 6,023,082 A | 2/2000 | McKee et al. |
| 5,830,270 A | 11/1998 | McKee et al. | 6,028,853 A | 2/2000 | Haartsen |
| 5,831,960 A | 11/1998 | Jiang et al. | 6,039,803 A | 3/2000 | Fitzgerald et al. |
| 5,833,603 A | 11/1998 | Kovacs et al. | 6,045,626 A | 4/2000 | Yano et al. |
| 5,834,362 A | 11/1998 | Miyagaki et al. | 6,046,464 A | 4/2000 | Schetzina |
| 5,838,035 A | 11/1998 | Ramesh | 6,048,751 A | 4/2000 | D'Asaro et al. |
| 5,838,053 A | 11/1998 | Bevan et al. | 6,049,110 A | 4/2000 | Koh |
| 5,844,260 A | 12/1998 | Ohori | 6,049,702 A | 4/2000 | Tham et al. |
| 5,846,846 A | 12/1998 | Suh et al. | 6,051,858 A | 4/2000 | Uchida et al. |
| 5,852,687 A | 12/1998 | Wickham | 6,051,874 A | 4/2000 | Masuda |
| 5,857,049 A | 1/1999 | Beranek et al. | 6,055,179 A | 4/2000 | Koganei et al. |
| 5,858,814 A | 1/1999 | Goossen et al. | 6,058,131 A | 5/2000 | Pan |
| 5,861,966 A | 1/1999 | Ortel | 6,059,895 A | 5/2000 | Chu et al. |
| 5,863,326 A | 1/1999 | Nause et al. | 6,064,078 A | 5/2000 | Northrup et al. |
| 5,864,171 A | 1/1999 | Yamamoto et al. | 6,064,092 A | 5/2000 | Park |
| 5,869,845 A | 2/1999 | Vander Wagt et al. | 6,064,783 A | 5/2000 | Congdon et al. |
| 5,872,493 A | 2/1999 | Ella | 6,078,717 A | 6/2000 | Nashimoto et al. |
| 5,873,977 A | 2/1999 | Desu et al. | 6,080,378 A | 6/2000 | Yokota et al. |
| 5,874,860 A | 2/1999 | Brunel et al. | 6,083,697 A | 7/2000 | Beecher et al. |
| 5,878,175 A | 3/1999 | Sonoda et al. | 6,087,681 A | 7/2000 | Shakuda |
| 5,879,956 A | 3/1999 | Seon et al. | 6,088,216 A | 7/2000 | Laibowitz et al. |
| 5,880,452 A | 3/1999 | Plesko | 6,090,659 A | 7/2000 | Laibowitz et al. |
| 5,882,948 A | 3/1999 | Jewell | 6,093,302 A | 7/2000 | Montgomery |
| 5,883,564 A | 3/1999 | Partin | 6,096,584 A | 8/2000 | Ellis-Monaghan et al. |
| 5,883,996 A | 3/1999 | Knapp et al. | 6,100,578 A | 8/2000 | Suzuki |
| 5,886,867 A | 3/1999 | Chivukula et al. | 6,103,008 A | 8/2000 | McKee et al. |
| 5,888,296 A | 3/1999 | Ooms et al. | 6,103,403 A | 8/2000 | Grigorian et al. |
| 5,889,296 A | 3/1999 | Imamura et al. | 6,107,653 A | 8/2000 | Fitzgerald |
| 5,896,476 A | 4/1999 | Wisseman et al. | 6,107,721 A | 8/2000 | Lakin |
| 5,905,571 A | 5/1999 | Butler et al. | 6,108,125 A | 8/2000 | Yano |
| 5,907,792 A | 5/1999 | Droopad et al. | 6,110,813 A | 8/2000 | Ota et al. |
| 5,912,068 A | 6/1999 | Jia | 6,110,840 A | 8/2000 | Yu |
| 5,919,515 A | 7/1999 | Yano et al. | 6,113,225 A | 9/2000 | Miyata et al. |
| 5,919,522 A | 7/1999 | Baum et al. | 6,113,690 A | 9/2000 | Yu et al. |
| 5,926,493 A | 7/1999 | O'Brien et al. | 6,114,996 A | 9/2000 | Nghiem |
| 5,926,496 A | 7/1999 | Ho et al. | 6,121,642 A | 9/2000 | Newns |
| 5,937,115 A | 8/1999 | Domash | 6,121,647 A | 9/2000 | Yano et al. |
| 5,937,274 A | 8/1999 | Kondow et al. | 6,128,178 A | 10/2000 | Newns |
| 5,937,285 A | 8/1999 | Abrokwah et al. | 6,134,114 A | 10/2000 | Ungermann et al. |
| 5,948,161 A | 9/1999 | Kizuki | 6,136,666 A | 10/2000 | So |
| 5,953,468 A | 9/1999 | Finnila et al. | 6,137,603 A | 10/2000 | Henmi |
| 5,955,591 A | 9/1999 | Imbach et al. | 6,139,483 A | 10/2000 | Seabaugh et al. |
| 5,959,308 A | 9/1999 | Shichijo et al. | 6,140,746 A | 10/2000 | Miyashita et al. |

| | | | | | | |
|---|---|---|---|---|---|---|
| 6,143,072 | A | 11/2000 | McKee et al. | 6,329,277 | B1 | 12/2001 | Liu et al. |
| 6,143,366 | A | 11/2000 | Lu | 6,338,756 | B1 | 1/2002 | Dietze |
| 6,146,906 | A | 11/2000 | Inoue et al. | 6,339,664 | B1 | 1/2002 | Farjady et al. |
| 6,150,239 | A | 11/2000 | Goesele et al. | 6,340,788 | B1 | 1/2002 | King et al. |
| 6,151,240 | A | 11/2000 | Suzuki | 6,341,851 | B1 | 1/2002 | Takayama et al. |
| 6,153,010 | A | 11/2000 | Kiyoku et al. | 6,343,171 | B1 | 1/2002 | Yoshimura et al. |
| 6,153,454 | A | 11/2000 | Krivokapic | 6,345,424 | B1 | 2/2002 | Hasegawa et al. |
| 6,156,581 | A | 12/2000 | Vaudo et al. | 6,348,373 | B1 | 2/2002 | Ma et al. |
| 6,171,905 | B1 * | 1/2001 | Morita et al. ............... 438/257 | 6,355,945 | B1 | 3/2002 | Kadota et al. |
| 6,173,474 | B1 | 1/2001 | Conrad | 6,359,330 | B1 | 3/2002 | Goudard |
| 6,174,755 | B1 | 1/2001 | Manning | 6,362,017 | B1 | 3/2002 | Manabe et al. |
| 6,175,497 | B1 | 1/2001 | Tseng et al. | 6,362,558 | B1 | 3/2002 | Fukui |
| 6,175,555 | B1 | 1/2001 | Hoole | 6,367,699 | B1 | 4/2002 | Ackley |
| 6,180,252 | B1 | 1/2001 | Farrell et al. | 6,372,356 | B1 | 4/2002 | Thornton et al. |
| 6,180,486 | B1 | 1/2001 | Leobandung et al. | 6,372,813 | B1 | 4/2002 | Johnson et al. |
| 6,181,920 | B1 | 1/2001 | Dent et al. | 6,376,337 | B1 | 4/2002 | Wang et al. |
| 6,184,044 | B1 | 2/2001 | Sone et al. | 6,389,209 | B1 | 5/2002 | Suhir |
| 6,184,144 | B1 | 2/2001 | Lo | 6,391,674 | B1 | 5/2002 | Ziegler |
| 6,191,011 | B1 | 2/2001 | Gilboa et al. | 6,392,253 | B1 | 5/2002 | Saxena |
| 6,194,753 | B1 | 2/2001 | Seon et al. | 6,392,257 | B1 | 5/2002 | Ramdani et al. |
| 6,197,503 | B1 | 3/2001 | Vo-Dinh et al. | 6,393,167 | B1 | 5/2002 | Davis et al. |
| 6,198,119 | B1 | 3/2001 | Nabatame et al. | 6,404,027 | B1 | 6/2002 | Hong et al. |
| 6,204,525 | B1 | 3/2001 | Sakurai et al. | 6,410,941 | B1 | 6/2002 | Taylor et al. |
| 6,204,737 | B1 | 3/2001 | Ella | 6,410,947 | B1 | 6/2002 | Wada |
| 6,208,453 | B1 | 3/2001 | Wessels et al. | 6,411,756 | B1 | 6/2002 | Sadot et al. |
| 6,210,988 | B1 | 4/2001 | Howe et al. | 6,415,140 | B1 | 7/2002 | Benjamin et al. |
| 6,211,096 | B1 | 4/2001 | Allman et al. | 6,417,059 | B1 | 7/2002 | Huang |
| 6,222,654 | B1 | 4/2001 | Frigo | 6,419,849 | B1 | 7/2002 | Qiu et al. |
| 6,224,669 | B1 | 5/2001 | Yi et al. | 6,427,066 | B1 | 7/2002 | Grube |
| 6,225,051 | B1 | 5/2001 | Sugiyama et al. | 6,432,546 | B1 | 8/2002 | Ramesh et al. |
| 6,229,159 | B1 | 5/2001 | Suzuki | 6,438,281 | B1 | 8/2002 | Tsukamoto et al. |
| 6,232,242 | B1 | 5/2001 | Hata et al. | 6,445,724 | B1 | 9/2002 | Abeles |
| 6,232,806 | B1 | 5/2001 | Woeste et al. | 6,452,232 | B1 | 9/2002 | Adan |
| 6,232,910 | B1 | 5/2001 | Bell et al. | 6,461,927 | B1 | 10/2002 | Mochizuki et al. |
| 6,233,435 | B1 | 5/2001 | Wong | 6,462,360 | B1 | 10/2002 | Higgins, Jr. et al. |
| 6,235,145 | B1 | 5/2001 | Li et al. | 6,477,285 | B1 | 11/2002 | Shanley |
| 6,238,946 | B1 | 5/2001 | Ziegler | 6,496,469 | B1 | 12/2002 | Uchizaki |
| 6,239,012 | B1 | 5/2001 | Kinsman | 6,498,358 | B1 | 12/2002 | Lach et al. |
| 6,239,449 | B1 | 5/2001 | Fafard et al. | 6,501,121 | B1 | 12/2002 | Yu et al. |
| 6,253,649 | B1 | 5/2001 | Kawahara et al. | 6,504,189 | B1 | 1/2003 | Matsuda et al. |
| 6,241,821 | B1 | 6/2001 | Yu et al. | 6,524,651 | B1 | 2/2003 | Gan et al. |
| 6,242,686 | B1 | 6/2001 | Kishimoto et al. | 6,528,374 | B1 | 3/2003 | Bojarczuk, Jr. et al. |
| 6,248,459 | B1 | 6/2001 | Wang et al. | 6,538,359 | B1 | 3/2003 | Hiraku et al. |
| 6,248,621 | B1 | 6/2001 | Wilk et al. | 6,589,887 | B1 | 7/2003 | Dalton et al. |
| 6,252,261 | B1 | 6/2001 | Usui et al. | 2001/0013313 | A1 | 8/2001 | Droopad et al. |
| 6,255,198 | B1 | 7/2001 | Linthicum et al. | 2001/0020278 | A1 | 9/2001 | Saito |
| 6,256,426 | B1 | 7/2001 | Duchet | 2001/0036142 | A1 | 11/2001 | Kadowaki et al. |
| 6,265,749 | B1 | 7/2001 | Gardner et al. | 2001/0055820 | A1 | 12/2001 | Sakurai et al. |
| 6,268,269 | B1 | 7/2001 | Lee et al. | 2002/0006245 | A1 | 1/2002 | Kubota et al. |
| 6,271,619 | B1 | 8/2001 | Yamada et al. | 2002/0008234 | A1 | 1/2002 | Emrick |
| 6,275,122 | B1 | 8/2001 | Speidell et al. | 2002/0021855 | A1 | 2/2002 | Kim |
| 6,277,436 | B1 | 8/2001 | Stauf et al. | 2002/0030246 | A1 | 3/2002 | Eisenbeiser et al. |
| 6,278,054 | B1 * | 8/2001 | Ho et al. .................... 136/256 | 2002/0047123 | A1 | 4/2002 | Ramdani et al. |
| 6,278,137 | B1 | 8/2001 | Shimoyama et al. | 2002/0047143 | A1 | 4/2002 | Ramdani et al. |
| 6,278,138 | B1 | 8/2001 | Suzuki | 2002/0052061 | A1 | 5/2002 | Fitzgerald |
| 6,278,523 | B1 | 8/2001 | Gorecki | 2002/0072245 | A1 | 6/2002 | Ooms et al. |
| 6,278,541 | B1 | 8/2001 | Baker | 2002/0076878 | A1 | 6/2002 | Wasa et al |
| 6,291,319 | B1 | 9/2001 | Yu et al. | 2002/0079576 | A1 | 6/2002 | Seshan |
| 6,291,866 | B1 | 9/2001 | Wallace | 2002/0131675 | A1 | 9/2002 | Litvin |
| 6,297,598 | B1 | 10/2001 | Wang et al. | 2002/0140012 | A1 | 10/2002 | Droopad |
| 6,297,842 | B1 | 10/2001 | Koizumi et al. | 2002/0145168 | A1 | 10/2002 | Bojarczuk, Jr. et al. |
| 6,300,615 | B1 | 10/2001 | Shinohara et al. | 2002/0179000 | A1 | 12/2002 | Lee et al. |
| 6,306,668 | B1 | 10/2001 | McKee et al. | 2002/0195610 | A1 | 12/2002 | Klosowiak |
| 6,307,996 | B1 | 10/2001 | Nashimoto et al. |
| 6,312,819 | B1 | 11/2001 | Jia et al. |

FOREIGN PATENT DOCUMENTS

| | | |
|---|---|---|
| DE | 197 12 496 | 10/1997 |
| DE | 198 29 609 | 1/2000 |
| DE | 100 17 137 | 10/2000 |
| EP | 0 247 722 | 12/1987 |
| EP | 0 250 171 | 12/1987 |
| EP | 0 300 499 | 1/1989 |
| EP | 0 309 270 | 3/1989 |

| | | | |
|---|---|---|---|
| 6,313,486 | B1 | 11/2001 | Kencke et al. |
| 6,316,785 | B1 | 11/2001 | Nunoue et al. |
| 6,316,832 | B1 | 11/2001 | Tsuzuki et al. |
| 6,319,730 | B1 | 11/2001 | Ramdani et al. |
| 6,320,238 | B1 | 11/2001 | Kizilyalli et al. |
| 6,326,637 | B1 | 12/2001 | Parkin et al. |
| 6,326,645 | B1 | 12/2001 | Kadota |
| 6,326,667 | B1 | 12/2001 | Sugiyama et al. |

| EP | 0 331 338 | 9/1989 | JP | 64-50575 | 2/1989 |
| --- | --- | --- | --- | --- | --- |
| EP | 0 331 467 | 9/1989 | JP | 64-52329 | 2/1989 |
| EP | 0 342 937 | 11/1989 | JP | 1-102435 | 4/1989 |
| EP | 0 392 714 | 10/1990 | JP | 1-179411 | 7/1989 |
| EP | 0 412 002 | 2/1991 | JP | 01-196809 | 8/1989 |
| EP | 0 455 526 | 6/1991 | JP | 03-149882 | 11/1989 |
| EP | 0 483 993 | 5/1992 | JP | HE. 2-391 | 1/1990 |
| EP | 0 494 514 | 7/1992 | JP | 02051220 | 2/1990 |
| EP | 0 514 018 | 11/1992 | JP | 3-41783 | 2/1991 |
| EP | 0 538 611 | 4/1993 | JP | 03046384 | 2/1991 |
| EP | 0 581 239 | 2/1994 | JP | 3-171617 | 7/1991 |
| EP | 0 600 658 | 6/1994 | JP | 03-188619 | 8/1991 |
| EP | 0 602 568 | 6/1994 | JP | 5-48072 | 2/1993 |
| EP | 0 607 435 | 7/1994 | JP | 5-086477 | 4/1993 |
| EP | 0 614 256 | 9/1994 | JP | 5-152529 | 6/1993 |
| EP | 0 619 283 | 10/1994 | JP | 05150143 | 6/1993 |
| EP | 0 630 057 | 12/1994 | JP | 05 221800 | 8/1993 |
| EP | 0 661 561 | 7/1995 | JP | 5-232307 | 9/1993 |
| EP | 0 860 913 | 8/1995 | JP | 5-238894 | 9/1993 |
| EP | 0 682 266 | 11/1995 | JP | 5-243525 | 9/1993 |
| EP | 0 711 853 | 5/1996 | JP | 5-291299 | 11/1993 |
| EP | 0 766 292 | 4/1997 | JP | 06-069490 | 3/1994 |
| EP | 0 777 379 | 6/1997 | JP | 6-232126 | 8/1994 |
| EP | 0 810 666 | 12/1997 | JP | 6-291299 | 10/1994 |
| EP | 0 828 287 | 3/1998 | JP | 6-334168 | 12/1994 |
| EP | 0 852 416 | 7/1998 | JP | 0812494 | 1/1996 |
| EP | 0 875 922 | 11/1998 | JP | 9-67193 | 3/1997 |
| EP | 0 881 669 | 12/1998 | JP | 9-82913 | 3/1997 |
| EP | 0 884 767 | 12/1998 | JP | 10-256154 | 9/1998 |
| EP | 0 926 739 | 6/1999 | JP | 10-269842 | 10/1998 |
| EP | 0 957 522 | 11/1999 | JP | 10-303396 | 11/1998 |
| EP | 0 964 259 | 12/1999 | JP | 10-321943 | 12/1998 |
| EP | 0 964 453 | 12/1999 | JP | 11135614 | 5/1999 |
| EP | 0 993 027 | 4/2000 | JP | 11-238683 | 8/1999 |
| EP | 0 999 600 | 5/2000 | JP | 11-260835 | 9/1999 |
| EP | 1 001 468 | 5/2000 | JP | 01 294594 | 11/1999 |
| EP | 1 035 759 | 9/2000 | JP | 11340542 | 12/1999 |
| EP | 1 037 272 | 9/2000 | JP | 2000-068466 | 3/2000 |
| EP | 1 043 426 | 10/2000 | JP | 2 000 1645 | 6/2000 |
| EP | 1 043 427 | 10/2000 | JP | 2000-278085 | 10/2000 |
| EP | 1 043 765 | 10/2000 | JP | 2000-349278 | 12/2000 |
| EP | 1 054 442 | 11/2000 | JP | 2000-351692 | 12/2000 |
| EP | 1 069 605 | 1/2001 | JP | 2001-196892 | 7/2001 |
| EP | 1 069 606 | 1/2001 | JP | 2002-9366 | 1/2002 |
| EP | 1 085 319 | 3/2001 | WO | WO 92/10875 | 6/1992 |
| EP | 1 089 338 | 4/2001 | WO | WO 93/07647 | 4/1993 |
| EP | 1 109 212 | 6/2001 | WO | WO 94/03908 | 2/1994 |
| EP | 1 176 230 | 1/2002 | WO | WO 95/02904 | 1/1995 |
| FR | 2 779 843 | 12/1999 | WO | WO 97/45827 | 12/1997 |
| GB | 1 319 311 | 6/1970 | WO | WO 98/05807 | 1/1998 |
| GB | 2 152 315 | 7/1985 | WO | WO 98/20606 | 5/1998 |
| GB | 2 335 792 | 9/1999 | WO | WO 99/14797 | 3/1999 |
| JP | 52-88354 | 7/1977 | WO | WO 99/14804 | 3/1999 |
| JP | 52-89070 | 7/1977 | WO | WO 99/19546 | 4/1999 |
| JP | 52-135684 | 11/1977 | WO | WO 99/63580 | 12/1999 |
| JP | 54-134554 | 10/1979 | WO | WO 99/67882 | 12/1999 |
| JP | 55-87424 | 7/1980 | WO | WO 00/06812 | 2/2000 |
| JP | 58-075868 | 5/1983 | WO | WO 00/16378 | 3/2000 |
| JP | 58-213412 | 12/1983 | WO | WO 00/33363 | 6/2000 |
| JP | 59-044004 | 3/1984 | WO | WO 00/48239 | 8/2000 |
| JP | 59-073498 | 4/1984 | WO | WO 01/04943 A1 | 1/2001 |
| JP | 59066183 | 4/1984 | WO | WO 01/16395 | 3/2001 |
| JP | 60-161635 | 8/1985 | WO | WO 01/33585 | 5/2001 |
| JP | 60-210018 | 10/1985 | WO | WO 01/37330 | 5/2001 |
| JP | 60-212018 | 10/1985 | WO | WO 01/59814 A2 | 8/2001 |
| JP | 61-36981 | 2/1986 | WO | WO 01/59820 A1 | 8/2001 |
| JP | 61-63015 | 4/1986 | WO | WO 01/59821 A1 | 8/2001 |
| JP | 61-108187 | 5/1986 | WO | WO 01/59837 | 8/2001 |
| JP | 62-245205 | 10/1987 | WO | WO 02 01648 | 1/2002 |
| JP | 63-34994 | 2/1988 | WO | WO 02/03113 | 1/2002 |
| JP | 63-131104 | 6/1988 | WO | WO 02/03467 | 1/2002 |
| JP | 63-198365 | 8/1988 | WO | WO 02/03480 | 1/2002 |
| JP | 63-289812 | 11/1988 | WO | WO 02/08806 | 1/2002 |

| | | |
|---|---|---|
| WO | WO 02/009150 | 1/2002 |
| WO | WO 02/09160 A2 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Int'l Non Volatile Memory Technology Conference*, pp. 34-37.

Wang et al., "Processing and Performance of Piezoelectric Films", Univ. Of MD, Wilcoxon Research Col, and Motorola Labs, May 11, 2000.

M. Rotter et al., "Nonlinear Accoustoelectric Interactions In GaAs/ LiNbO$_3$ Structures", *Applied Physics Letters*, Vol. 75(7), Aug. 16, 1999, pp. 965-967.

K. Sreenivas et al., "Surface Acoustic Wave Propagation on Lead Zirconate Titanate Thin Films," *Appl. Phys. Lett.* 52 (9), Feb. 29, 1998, pp. 709-711.

M. Rotter et al., "Single Chip Fused Hybrids for Acousto-Electric and Acousto-Optic Applications," *1997 Applied Physics Letters*, vol. 70(16), Apr. 21, 1997, pp. 2097-2099.

A. Mansingh et al., "Surface Acoustic Wave Propagation in PZT/ YBCO/SrTiO$_3$ and PbTiO$_3$ /YBCO/SrTiO$_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", Science, vol. 276, Apr. 11, 1997, pp. 238-240.

R. Houdre et al., "Properties of GaAs on Si Grown by Molecular Beam Epitaxy,"*Solid State and Materials Sciences*, vol. 16, Issue 2, 1990, pp. 91-114.

S. F. Fang et al., "Gallium Arsenide and Other Compound Semiconductors on Silicon,"*J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Intergration of III-V Materials and Devices with Si Using Graded GeSi Buffers," 27th International Symposium on Compound Semiconductors, Oct. 2000.

Zogg et al., "Progress In Compound-Semiconductor-on-Silicon-Heteroepitaxy with Fluoride Buffer Layers," *J. Eletrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 12, No. 2, Feb. 2000, pp. 110-112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661-666, 1999.

Gunapala et al., "Bound-to-Quasi-Bound Quantum-Well Infrared Photodetectors," NASA Tech Brief, vol. 22, No. 9, Sep. 1998.

Abhay M. Joshi et al., "Monolithic InGaAs-on-silicon Wave Infrared Detector Arrays," *Intn. Society for Optical Engineering*, vol. 2999, pp. 211-224.

Bruley et al., "Nanostructure and Chemistry of a (100)MgO/(100) GaAs Interface," *Appl. Phys Lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial La$_{0.67}$Sr$_{0.33}$ MnO$_3$ Magnetic Tunnel Junctions," *J. Appl. Phys.* 81(8), Apr. 15, 1997, pp. 5509-5511.

O'Donnell et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1916.

Mikami et al., "Formation of Si Epi/MgO-Al$_2$O$_3$Epi./SiO$_3$/Si and its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143-150.

T. Chikyow et al., "Reaction and Regrowth Control of CeO$_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Talus Corporation, Qualcomm QCP-800 Technical Analysis Report, Dec. 10, 1996, pp. 5-8.

Jo-Ey Wong, et al.; "An Electrostatically-Actuated MEMS Switch For Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology": IEEE Electron Device Letters, vol. 21. No. 5, May 2000; pp. 230-232.

F.M. Buffer, et al.; "Strain-dependence of electron transport in bulk Si and deep-submicron MOSFET's" Computatural Electronics, 2000, Book of Abstracts, IWCE Glasgow 2000, 7th Int'l Workshop on, 2000; pp. 64-65.

S.S. Lu, et al., "Piezoelectric field effect transistor (PEFET) using In$_{0.2}$Ga$_{0.8}$As/Al$_{0.35}$ Ga$_{0.65}$As/In$_{0.2}$Ga$_{0.8}$As/GaAs Strained layer structure on (111)B GaAs substrate"; Electronics Letters, 12TH Ma 1994, vol. 30, No. 10; pp. 823-825.

Kihong Kim, et al. "On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulation Transmitter With Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-466.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1-3.

Nagata et al., "Heteroepitaxial Growth of CeO$_2$(001) Substrates by Pulsed Laser Deposition in Ultrahigh Vacuum," *Jpn. Jour. Appl. Phys.*, vol. 30, No. 6B, Jun. 1991, pp. L1136-L1138.

Kado et al., "Heteroepitaxial Growth of SrO Flims on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah, et al.; "A Manufacturable High-Speed Low-Power Complementary GaAs Process"; Extended Abstracts of the 1994 International Conference on Solid Stae Devices and Materials, Yokohama, 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional infrared GaAs/Al$_x$O$_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G. H. Jin, et al.; "PLZT Film Waveguide Mach-Zehnder Electrooptic Modulator"; Journal of Lightwave Technology, vol. 18, No. 6. Jun. 2000; pp. 807-812.

D.E. Aspnes, et al.; "Steps on (001) silicon surfaces"; J. Vac. Sci. Technol. B, vol. 5, No. 4, Jul./Aug. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and Si CMOS Circuits"; IEEE Electron Device Letters, vol. 9, No. 9, Sep. 1988; pp. 444-446.

H. Shichijo, et al.; "GaAs MESFET and Si CMOS Cointegration and Circuit Techniques"; 1988 IEEE; GaAs IC Symposium—239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507-509.

Tomonori Nagashima, et al.; "Three-Terminal Tandem Solar Cells With a Back-Contact Type Bottom Cell" Higashifuji Technical Center, Toyota Motor Corporation; 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al.; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center(Abstract).

R.D. Vispute; "High quality optoelectronic grade epitaxial AlN films on -$Al_2O_3$, Si and 6H-SiC by pulsed laser deposition"; Thin Solid Films 299 (1997), pp. 94-103.

T. Warren Weeks, et al.; "GaN thin films deposited via organometalic vapor phase epitaxy on (6H)-SiC(0001) using high-temperature monocrystalline AlN buffer layers" 320 Applied Physics Letters, vol. 67, No. 3, Jul. 17, 1995; pp. I401-I403.

Z. Yu, et al.; "Epitaxial oxide thin films on Si(001)"; J. Vac. Sci. Technol. B. vol. 18, No. 4, Jul./Aug. 2000; pp. 2139-2145.

Gentex Corporate Website: Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis, et al.; "A single-chip linear optical amplifier"; OFC, 2001; Mar. 17-22, 2001.

G. Vogg et al.; "Epitaxial alloy films of zinti-phase Ca(Si1–xGex)2"; Journal of Crystal Growth 223 (2001); pp. 573-576.

Peter S. Guilfoyle, et al.; "Optoelectronic Architecture for High-Speed Switching and Processing Applications"; 1998 The Photonics Design and Applications Handbook; pp. H-399-H-406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heldelberg, 1989, 1996.

"Integration of GaAs on Si Using a Spinel Buffer Layer", IBM Technical Bulletin, vol. 30, No. 6, Nov. 1987, p. 365.

"GainAs Superconducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ films on Silicon Substrates," Japan J of Appl. Phys., vol. 33, Mar. 1994, pp. 1472-1477.

Yodo et al., GaAs Heteroepitaxcial Growth on Si Substrates with Thin Si Interlayers in situAnnealed at High Temperatures, 8257b Journal of Vacuum Science & Technology, May/Jun. 1995, vol. 13, No. 3, pp. 1000-1005.

Cuomo et al., "Substrates Effect on the Superconductivity of $YBa_2Cu_3O_7$ Thin Films," AIP Conference 1988, pp. 141-148.

McKee et al., "Crystalline Oxides on Silicon: The First Five Monolayers," Physical Review Letters, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," 1991 American Institute of Physics, pp. 782-784, Aug. 13, 1991.

Tambo et al., Molecular Beam Epitaxy Growth of $SrTiO_3$ Films on Si(100)—2×1 with SrO Buffer Layer, Jpn. J. Appl. Phys., vol. 37, 1998, pp. 4454-4459.

McKee et al., "The MBE Growth and Optical Quality of $BaTiO_3$ and Thin Films on MgO," Mat. Res. Soc. Symp. Proc., vol. 341, Apr. 1994, pp. 309-314.

McKee et al., "$BaSi_2$ and Thin Film Alkaline Earth Silicides on Silicon," Appl. Phys. Lett., 63 (20), Nov. 1993, pp. 2818-2820.

McKee et al., "Surface Structures and the Orthorhombic Transformation of Thin Film $BaSi_2$ on Silicon," Mat. Res. Soc. Symp. Proc., vol. 221, pp. 131-136.

Brian A. Floyd, et al.; "The projected Power Consumption of a Wireless Clock Distrubution System and Comparison to Conventional Distribution Systems"; IEEE, 1999; pp. IITC99-249-IITC99-250.

Mori et al., "Epitaxial Growth of $SrTiO_3$ Films on Si(100) Substrates Using a Focused Electron Beam Evaporation Method," Jpn. J. of Apl. Phys., vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," Jpn. J. of Appl. Phys., vol. 33, (1994), pp. 5911-5916.

Farrow et al., "Heteroepitaxy of Dissimilar Materials," Mat. Res. Soc. Symposium Proceedings, vol. 221, pp. 29-34, Apr. 29-May 2, 1991.

Ishiwara et al., "Heteroepitaxy on Silicon: Fundamentals, Structure, and Devices," Mat Res. Soc., Symposium Proceedings, vol. 116, pp. 369-374, Apr. 5-8, 1988.

Douglas B. Chrisey, et al; Pulsed Laser Deposition of Thin Films; pp. 273-285.

B.A. Block, et al; "Photoluminescence properties of $Er^3$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60-63, XP010210167.

Wenhua Zhu et al.; "Molecular Beam Epitaxy of GaAs on Si-on-Insulator"; 320 Applied Physics Letters 59 Jul. 8, 1991, No. 2; pp. 210-212.

Umesh K. Mishra et al; "Oxide Based Compound Semiconductor Electronics";Electron Devices Meeting; 1997; Technical Digest, International; Washington, D.C.; Dec. 7-10, 1997; pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; December 1, 1998; pp. 14143-14146.

Q.-Y. Tong et al.; "IOS-a new type of materials combination for system-on-a-chip preperation"; 1999 IEEE International SOI Conference, Oct. 1999; pp. 104-105.

T.Kanniainen et al.; "Growth of Dielectric 1hfo2/Ta205 Thin Films Nanolaminate Capacitors By Atomic Layer Epitaxy"; Eletrochemical Society Proceedings, U.S. Electrochemical Society; Pennington, N.J.; Aug. 31, 1997; pp. 36-46.

Myung Bok Lee; "Heteroepitaxial Growth of BaTiO$_3$ Films on Si by Pulsed Laser Deposition"; Applied Physics Letters; Mar. 13, 1995; pp. 1331-1333.

Myung Bok Lee; "Formation and Characterization of Epitaxial TiO$_2$ and Ba TiO$_3$/TiO$_2$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelectric La-Sr-Co-O/Pb-Zr-Ti-O/La-Sr-Co-O Heterostructures on Silicon via Template Growth"; 320 Applied Physics Letters; 63 Dec. 27, 1993; No. 26; pp. 3592-3594.

K. Eisenbeiser; "Field Effect Transistors with SrTiO$_3$ Gate Dielectric on Si"; Applied Physics Letters; vol. 76, No. 10; Mar. 6, 2000; pp. 1324-1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in La$_{0.8}$Sr$_{0.2}$MnO$_3$/SrTiO$_3$/La$_{0.8}$Sr$_{0.2}$MnO$_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using YbaCuO/CeO$_2$ Heterostructures"; Physica C; vol. 282-287, No. 2003; Aug. 1, 1997; pp. 1231-1232.

Shogo Imada et al.; "Epitaxial Growth of Ferroelectric YmnO$_3$ Thin Films on Si (111) Substrates by Molecular Beam Epitaxy"; Jpn. J. Appl. Phys. vol. 37 (1998); pp. 6497-6501; Part 1, No. 12A, Dec. 1998.

Ladislav Pust et al.; "Temperature Dependence of the Magnetization Reversal in Co(fcc)-BN-Co(poly hcp) Structures"; Journal of Applied Physics; vol. 85, No. 8; Apr. 15, 1999, pp. 5765-5767.

C. Martinez; "Epitaxial Metallic Nanostructures on GaAs"; Surface Science; vol. 482-485; pp. 910-915; 2001.

Wen-Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of ZnO/SiO$_2$/Si Monolithic Integrated Programmable SAW Filter"; Proceedings of Fifth International Conference on Solid-State and Integrated Circuit Technology; Oct. 21-23, 1998; pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP-bonded-to Si Substrate"; Fourth International Conference on Indium Phosphide and Related Materials, Newport, RI, USA; Apr. 21-24, 1992 ; pp. 167-170; XP000341253; IEEE, New York, NY, USA; ISBN: 0-7803-0522-1.

H. Takahashi et al.; "Arrayed-Waveguide Grating For Wavelength Division Multi/Demultiplexer With Nanometre REsolution"; Electronics Letters; vol. 26., No. 2, Jan. 18, 1990.

Pierret, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al.: "Epitaxial Growth and Structure of Cubic and Pseudocubic Perovskite Films on Perovskite Substrates"; Mat. Res. Soc. Symp. Proc., vol. 401; 1995 Materials Research Society; pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A.Y. Wu et al.; "Highly Oriented (Pb,La)(Zr,Ti) O$_3$ Thin Films on Amorphous Substrates"; IEEE, 1992; pp. 301-304.

Timothy E. Glassman et al.; "Evidence for Cooperative Oxidation of MoCVD Precursors Used in Ba$_x$Sr$_{1-x}$TiO$_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-os-Si"; IEEE; GaAs IC Symposium-163-166; 1989.

T.A. Langdo et al.; "High Quality Ge on Si by Epitaxial Necking"; Applied Physics Letters ; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al.; "Room Temperature Photonic Crystal Defect Lasers at Near-Infrared Wavelengths in InGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si: Progress and Potential Applications"; Mat. Res. Soc. Symp. Proc.; pp. 15-30; 1987.

G.J.M. Dormans, et al.; "PbTiO/$_3$/Thin Films Grown by Organometallic Chemical Vapour Deposition"; Third International Symposium on Intergrated Ferroelectrics; Apr. 3-5, 1991 (Abstract).

P.J. Borrelli et al.; "Compositional and Structural Propeties of Sputtered PLZT Thin Films"; Ferroelctric Thin Films II Symposium; Dec. 2-4, 1991 (Abstract).

Ranu Nayak et al.; "Enhanced acoust-optic diffraction efficiency in a symmetric SrRiO3/BaTiO3/SrTiO3 thin-film heterostructure"; Nov. 1, 2000; vol. 39, No. 31; Applied Optics; pp. 5847-5853.

Ranu Nayak et al.; "Studies on aousto-optical interaction in SrTiO3//BaTiO3/SrTiO3 epitaxial thin film heterostructures"; J. Phys. D: Appl. Phys. 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon"; Device Research Conference, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications": Semiconductor Magazine; vol. 3, No. 3; Mar. 2002.

Alex Chediak et al; "Intergration of GaAs/Si with Buffer Layers and its Impact on Device Integration"; TICS 4, Prof. Sands. MSE 225, Apr. 12, 2002; pp. 1-5.

S.A. Chambers et al; "Band Discontinuities at Epitaxial SrTiO3/ Si(001) Heterojunctions"; Applied Physics Letters; vol. 77, No. 11; Sep. 11, 2000; pp. 1662-1664.

H. Wang et al.; "GaAs/GaAlAs Power HBTs for Mobile Communications"; Microwave Symposium Digest; 1993 IEEE; vol. 2.; pp. 549-552.

Y. Ota et al.; "Application of Heterojunction FET to Power Amplifier for Cellular Telephone"; Electronics Letters; May 26, 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures "; 2194 Thin Solid Films; 181 Dec. 10, 1989; No. 1; pp. 213-225.

K. Nashimoto et al; "Patterning of Nb, LaOnZr, TiO3 Waveguides for Fabricating Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Tatanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped $TiO_2$ Anatase"; Applied Physics Letters; vol. 79. No. 21; Nov. 19, 2001; pp. 3467-3469.

Charles Kittle; "Introduction to Solid State Physics"; John Wiley & Sons, Inc. Fifth Edition; pp. 415.

Chyuan-Wei Chen et al; "Liquid-phase epitaxial growth and characterization of InGaAsP layers grown on GaAsP substrates for application to orange light-emitting diodes"; 931 Journal of Applied Physics; 77 Jan. 15, 1995, No. 2; Woodbury, NY, US; pp. 905-909.

W. Zhu et al. ; "Oriented diamond films grown on nickel substrates"; 320 Applied Physics Letters; 63 Sep. 1993, No. 12, Woodbury, NY, US; pp. 1640-1642.

M. Shreck et al.; "Diamond/Ir/$SrTiO_3$: A material combination for improved heteroepitaxial diamond films"; Applied Physics Letters; vol. 74, No. 5, Feb. 1, 1999; pp. 650-652.

Yoshihiro Yokota et al.; "Cathodoluminescence of boron-doped heteroepitaxial diamond films on platinum"; Diamond and Related Materials 8(1999); pp. 1587-1591.

J.R. Busch et al.; "Linear Electro-Optic Response in Sol-Gel PZT Planar Waveguide"; Electronics Letters; Aug. 13, 1992; vol. 28, No. 17; pp. 1591-1592.

R. Droopad et al.; "Epitaxial Oxide Films on Silicon: Growth, Modeling and Device Properties"; Mat. Res. Soc. Symp. Proc. vol. 619; 2000 Materials Research Society; pp. 155-165.

H. Ohkubo et al.; "Fabrication of High Quality Perovskite Oxide Films by Lateral Epitaxy Verified with RHEED Oscillation"; 2419A Int. Conf. on Solid State Devices & Materials, Tsukuba, Aug. 26-28, (1992); pp. 457-459.

Lin Li; "Ferroelectric/Superconductor Heterostructures"; Materials Science and Engineering; 29 (2000) pp. 153-181.

L. Fan et al.; "Dynaamic Beam Switching of Vertical-Cavity Surface-Emitting Lasers with Integrated Optical Beam Routers"; IEEE Photonics Technology Letters; vol. 9, No. 4; Apr. 4, 1997; pp. 505-507.

Y. Q. Xu et al.; "(Mn, Sb) dropped-Pb(Zr, Ti)03 infared detector arrays"; Journal of Applied Physics; vol. 88, No. 2; Jul. 15, 2000; pp. 1004-1007.

Kiyoto Kato et al.; "Reduction of dislocations in InGaAs using epitaxial lateral overgrowth"; 2300 Journal of Crystal Growth 115 (1991) pp. 174-179; Dec. 1991.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBizTech; Nov. 2001, pp. 1-3.

"Holy Grail! Motorola Claims High Yield GaAs Breakthrough"; Micromagazine.com no date available; pp. 1-3.

Jong-Gul Yoon; "Growth of Ferroelectric $LiNbO_3$ Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of $LiTaO_3$ thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Intrgration of $Pb(Zr0.52Ti0.48)O_3$ epilayers with Si by domain epitaxy"; Applied Physics Letters, vol. 76, No. 11; Mar. 13, 2000; pp. 1458-1460.

Dwight C. Streit et al; "High Reliabilty GaAs-AlGaAs HBT's by MBE with Be Base Doping and InGaAs Emitter Contacts"; 8179 Ieee Electron Device Letters; Sep. 12, 1991, No. 9, New York, US.

C. Y. Hung et al; "Piezoelectrically induced stress tuning of electro-optic devices"; 320 Applied Physics Letters; 59Dec. 30, 1991, No. 27, New York, US.

J. Piprek; "Heat Flow Analysis of Long-Wvelength VCSELs with Various DBR Materials"; University of Delaware, Materials Science, Newark, DE, 19716-3106; Oct. 31, 1994; pp. 286-287.

P. Mackowiak et al.; "Some Aspects of designing an efficient nitride VCSEL resonator"; J. Phys. D: Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.; "Thin film crystal growth of $BaZrO_3$ at low oxygen partial pressure"; Journal of Crystal Growth 243 (2002); pp. 164-169.

M.E. Hawley; et al; "Microstructual Study of Colossal Magneto-Resistive Films As a Function of Growth Temperature, As Deposited and Annealed"; 401, 1996; pp. 531-536.

Yi W. et al; "Mechanism of cleaning Si (100) surface using Sr and SrO for the growth of crystalline $SrTiO/sub\ 2/films$"Journal of Vacuum Science & Technology, vol. 20, No. 4, Jul. 2002 pp. 1402-1405.

Xiaming Hu et al; "Sr/Si template formation for the epitaxial growth of $SrTiO/sub\ 3/on$ silicon" Materials Research Society Proceedings, vol. 716, 2002, pp. 261-266.

* cited by examiner

HETEROJUNCTION TUNNELING DIODES AND PROCESS FOR FABRICATING SAME

This application is a continuation of application Ser. No. 09/624,691 filed Jul. 24, 2000, now abandoned.

FIELD OF THE INVENTION

This invention relates generally to semiconductor structures and devices and to a method for their fabrication, and more specifically to the fabrication and use of resonant heterojunction tunnel diodes that include a monocrystalline compound semiconductor material.

BACKGROUND OF THE INVENTION

The vast majority of semiconductor discrete devices and integrated circuits are fabricated from silicon, at least in part because of the availability of inexpensive, high quality monocrystalline silicon substrates. Other semiconductor materials, such as the so-called compound semiconductor materials, have physical attributes, including wider bandgap and/or higher mobility than silicon, or direct bandgaps that make these materials advantageous for certain types of semiconductor devices. Unfortunately, compound semiconductor materials are generally much more expensive than silicon and are not available in large wafers as is silicon. Gallium arsenide (GaAs), the most readily available compound semiconductor material, is available in wafers only up to about 150 millimeters (mm) in diameter. In contrast, silicon wafers are available up to about 300 mm and are widely available at 200 mm. The 150 mm GaAs wafers are many times more expensive than are their silicon counterparts. Wafers of other compound semiconductor materials are even less available and are more expensive than GaAs.

Because of the desirable characteristics of compound semiconductor materials, and because of their present generally high cost and low availability in bulk form, for many years attempts have been made to grow thin films of the compound semiconductor materials on a foreign substrate. To achieve optimal characteristics of the compound semiconductor material, however, a monocrystalline film of high crystalline quality is desired. Attempts have been made, for example, to grow layers of a monocrystalline compound semiconductor material on germanium, silicon, and various insulators. These attempts have generally been unsuccessful because lattice mismatches between the host crystal and the grown crystal have caused the resulting thin film of compound semiconductor material to be of low crystalline quality.

If a large area thin film of high quality monocrystalline compound semiconductor material was available at low cost, a variety of semiconductor devices could advantageously be fabricated in that film at a low cost compared to the cost of fabricating such devices on a bulk wafer of compound semiconductor material or in an epitaxial film of such material on a bulk wafer of compound semiconductor material. In addition, if a thin film of high quality monocrystalline compound semiconductor material could be realized on a bulk wafer such as a silicon wafer, an integrated device structure, such as, for example, a resonant heterojunction tunnel diode, could be achieved that took advantage of the best properties of both the silicon and the compound semiconductor material.

Tunnel diodes, where carriers tunnel through the band gap of a doped p-n junction, have taken many forms since first proposed in about 1958. Tunnel diodes provide very fast switching time and low power dissipation. The first tunnel diode, called an Esaki tunneling diode (after its originator), comprised two silicon regions of different conductivity types with both being highly doped. When bias is applied to the Esaki-type diode, the available states for electrons in the contact layer align with available states for holes in the valence band of the injection layer and tunneling occurs. Traditional Esaki diodes formed in silicon-based material systems, however, exhibit low peak current densities, low peak-to-valley current ratios, and low operational frequencies, which make them unsuitable for present-day demands for enhanced performance in areas such as high frequency circuits, portable communications systems, and digital applications. Thus, present-day Esaki-type diodes may comprise germanium, gallium arsenide, or other semiconductor materials, which exhibit more suitable electrical properties. For example, tunnel diodes having the most favorable electrical properties are currently manufactured in compound semiconductor material systems comprising materials such as indium aluminum arsenide (InAlAs), indium gallium arsenide (InGaAs), indium phosphide (InP), gallium arsenide (GaAs), and aluminum arsenide (AlAs). Unfortunately, as stated above, such compound semiconductor substrates tend to be expensive and extremely fragile.

Accordingly, a need exists for a semiconductor structure that provides a high quality monocrystalline compound semiconductor film over another monocrystalline material and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
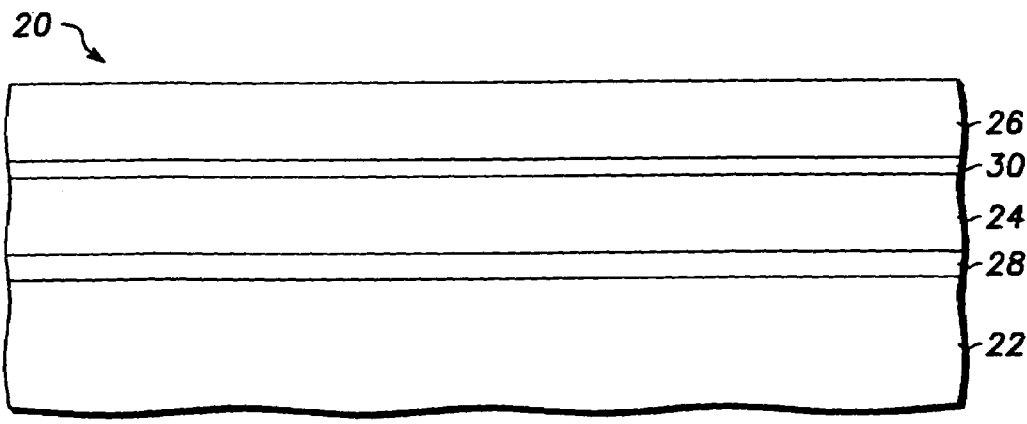
FIGS. 1–3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and compound semiconductor layer 26. As will be explained more fully below, the template layer helps to initiate the growth of the compound semiconductor layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with the underlying substrate and with the overlying compound semiconductor material. For example, the material could be an oxide or nitride having a lattice structure substantially matched to the substrate and/or to the subsequently applied semiconductor material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:
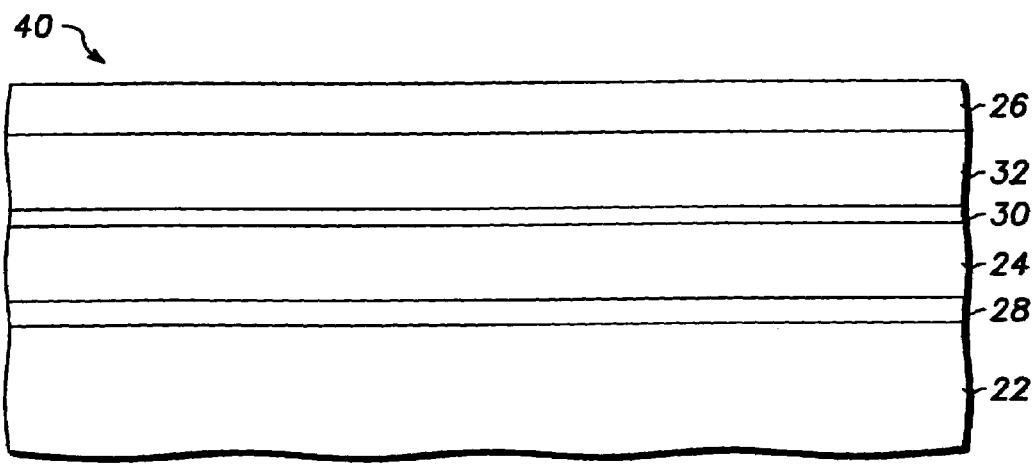

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and layer of monocrystalline compound semiconductor material 26. Specifically, the additional buffer layer is positioned between template layer 30 and the overlying layer of compound semiconductor material. The additional buffer layer, formed of a semiconductor or compound semiconductor material, serves to provide a lattice compensation when the lattice constant of the accommodating buffer layer cannot be adequately matched to the overlying monocrystalline compound semiconductor material layer.

Figure 3:
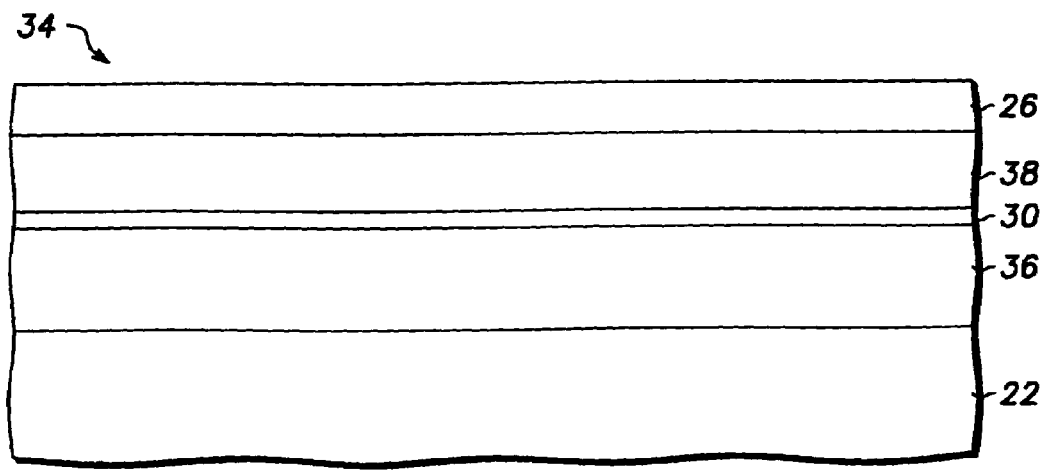

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional semiconductor layer 38.

As explained in greater detail below, amorphous layer 36 may be formed by first forming an accommodating buffer layer and an amorphous interface layer in a similar manner to that described above. Monocrystalline semiconductor layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and semiconductor layer 38 (subsequent to layer 38 formation) relieves stresses between layers 22 and 38 and provides a true compliant substrate for subsequent processing—e.g., compound semiconductor layer 26 formation.

The processes previously described above in connection with FIGS. 1 and 2 are adequate for growing monocrystalline compound semiconductor layers over a monocrystalline substrate. However, the process described in connection with FIG. 3, which includes transforming a monocrystalline accommodating buffer layer to an amorphous oxide layer, may be better for growing monocrystalline compound semiconductor layers because it allows any strain in layer 26 to relax.

Semiconductor layer 38 may include any of the materials described throughout this application in connection with either of compound semiconductor material layer 26 or additional buffer layer 32. For example, layer 38 may include monocrystalline Group IV or monocrystalline compound semiconductor materials.

In accordance with one embodiment of the present invention, semiconductor layer 38 serves as an anneal cap during layer 36 formation and as a template for subsequent semiconductor layer 26 formation. Accordingly, layer 38 is preferably thick enough to provide a suitable template for layer 26 growth (at least one monolayer) and thin enough to allow layer 38 to form as a substantially defect free monocrystalline semiconductor compound.

In accordance with another embodiment of the invention, semiconductor layer 38 comprises compound semiconductor material (e.g., a material discussed above in connection with compound semiconductor layer 26) that is thick enough to form devices within layer 38. In this case, a semiconductor structure in accordance with the present invention does not include compound semiconductor layer 26. In other words, the semiconductor structure in accordance with this embodiment only includes one compound semiconductor layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 10 nm. In general, it is desired to have an accommodating buffer layer thick enough to isolate the compound semiconductor layer from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1.5–2.5 nm.

In accordance with this embodiment of the invention, compound semiconductor material layer 26 is a layer of gallium arsenide (GaAs) or aluminum gallium arsenide (AlGaAs) having a thickness of about 1 nm to about 100 micrometers (μm) and preferably a thickness of about 0.5 μm to 10 μm. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been shown to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of compound semiconductor materials in the indium phosphide (InP) system. The compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 μm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In-Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. The II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying compound semiconductor material. The compositions of other materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline compound semiconductor material layer. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between the accommodating buffer layer and the overlying monocrystalline compound semiconductor material layer. The buffer layer, a further monocrystalline semiconductor material, can be, for example, a graded layer of indium gallium arsenide (InGaAs) or indium aluminum arsenide (InAlAs). In accordance with one aspect of this embodiment, buffer layer 32 includes InGaAs, in which the indium composition varies from 0 to about 47%. The buffer layer preferably has a thickness of about 10–30 nm. Varying the composition of the buffer layer from GaAs to InGaAs serves to provide a lattice match between the underlying monocrystalline oxide material and the overlying layer of monocrystalline compound semiconductor material. Such a buffer layer is especially advantageous if there is a lattice mismatch between accommodating buffer layer 24 and monocrystalline compound semiconductor material layer 26.

EXAMPLE 6

This example provides exemplary materials useful in structure 34, as illustrated in FIG. 3. Substrate material 22, template layer 30, and monocrystalline compound semiconductor material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of semiconductor material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline compound semiconductor material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
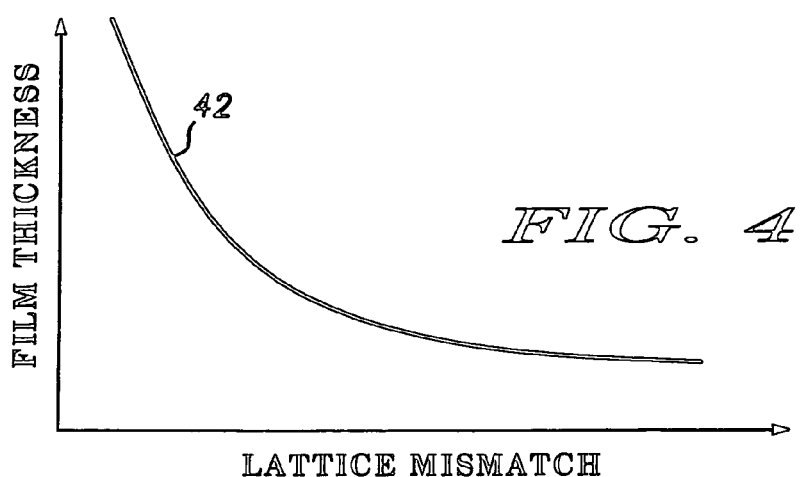
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that has a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. If the grown crystal is gallium arsenide, aluminum gallium arsenide, zinc selenide, or zinc sulfur selenide and the accommodating buffer layer is monocrystalline $Sr_x Ba_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown compound semiconductor layer can be used to reduce strain in the grown monocrystalline compound semiconductor layer that might result from small differences in lattice constants. Better crystalline quality in the grown monocrystalline compound semiconductor layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkali earth metals or combinations of alkali earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkali earth metal oxide, such as strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired compound semiconductor material. For the subsequent growth of a layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
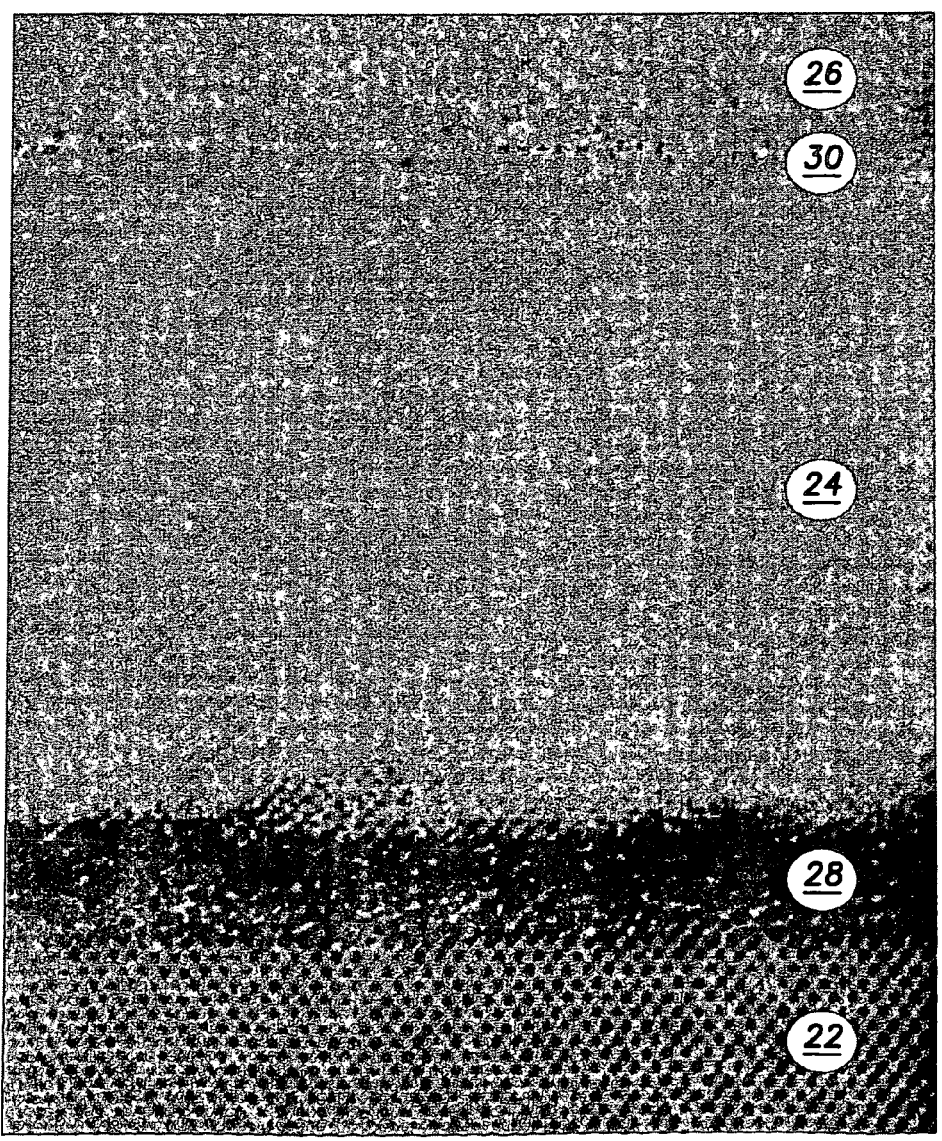
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with the present invention. Single crystal SrTiO$_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
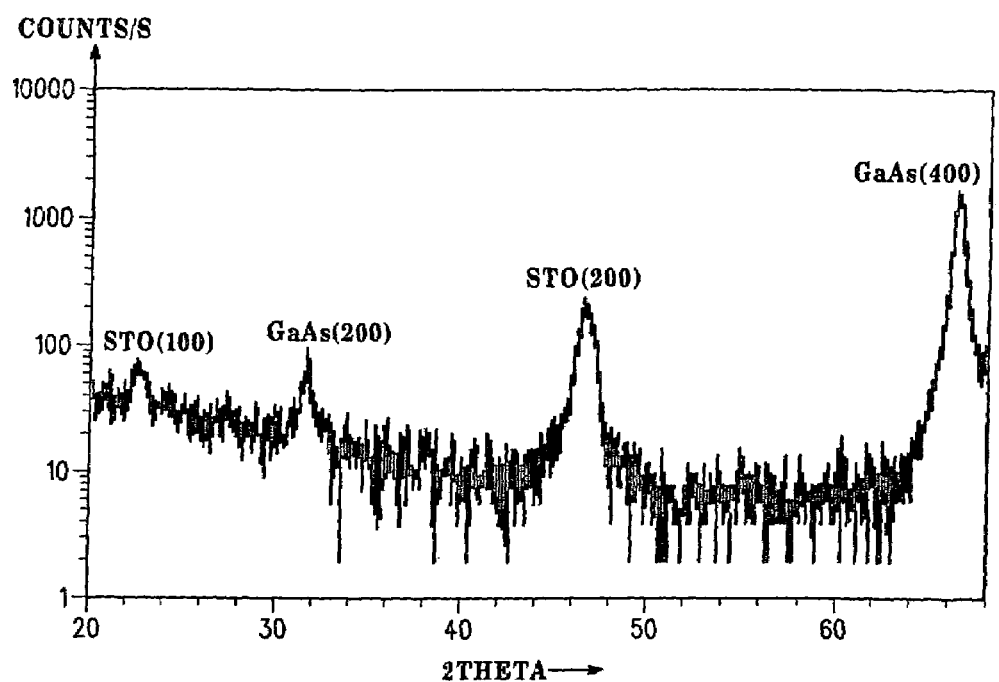
FIG. 6 illustrates an x-ray diffraction spectrum of a structure including a monocrystalline accommodating buffer layer.

FIG. 6 illustrates an x-ray diffraction spectrum taken on structure including GaAs compound semiconductor layer 26 grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The buffer layer is formed overlying the template layer before the deposition of the monocrystalline compound semiconductor layer. If the buffer layer is a compound semiconductor superlattice, such a superlattice can be deposited, by MBE for example, on the template described above. If instead the buffer layer is a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and semiconductor layer 38 to a rapid thermal anneal process with a peak temperature of about 700° C. to about 1000° C. and a process time of about 10 seconds to about 10 minutes. However, other suitable anneal processes may be employed to convert the accommodating buffer layer to an amorphous layer in accordance with the present invention. For example, laser annealing or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26 may be employed to deposit layer 38.

Figure 7:
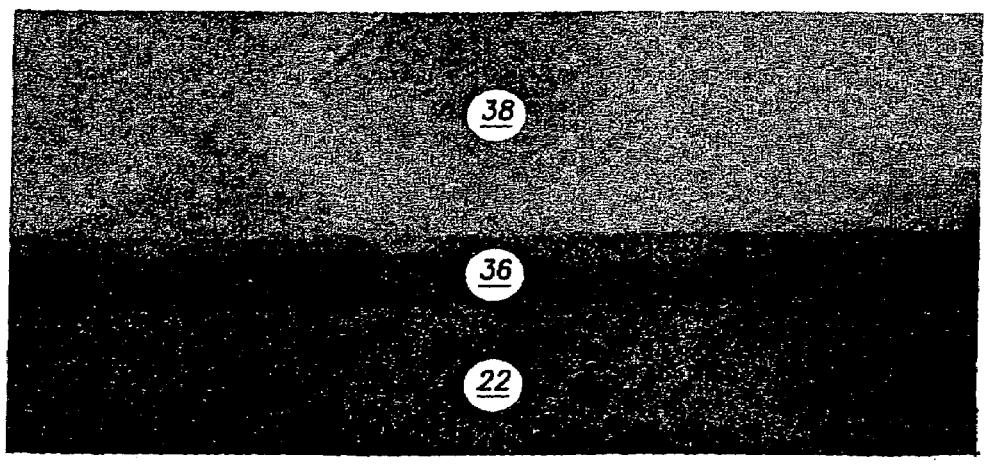
FIG. 7 illustrates a high resolution Transmission Electron Micrograph of a structure including an amorphous oxide layer.

FIG. 7 is a high resolution Transmission Electron Micrograph (TEM) of semiconductor material manufactured in accordance with the embodiment of the invention illustrated in FIG. 3. In accordance with this embodiment, a single crystal SrTiO$_3$ accommodating buffer layer was grown epitaxially on silicon substrate 22. During this growth process, an amorphous interfacial layer forms as described above. Next, GaAs layer 38 is formed above the accommodating buffer layer and the accommodating buffer layer is exposed to an anneal process to form amorphous oxide layer 36.

Figure 8:
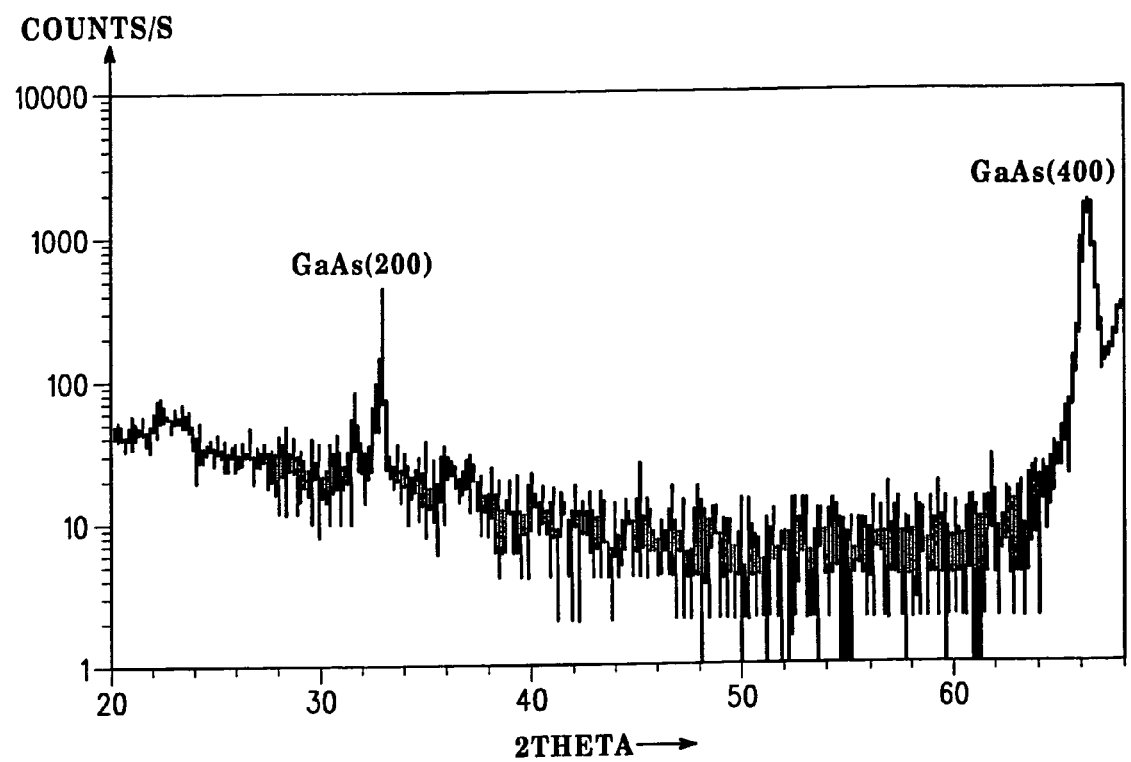
FIG. 8 illustrates an x-ray diffraction spectrum of a structure including an amorphous oxide layer.

FIG. 8 illustrates an x-ray diffraction spectrum taken on a structure including GaAs compound semiconductor layer 38 and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, perovskite oxides such as alkaline earth metal tin-based perovskites, lanthanum aluminate, lanthanum scandium oxide, and gadolinium oxide can also be grown. Further, by a similar process such as MBE, other III–V and II–VI monocrystalline compound semiconductor layers can be deposited overlying the monocrystalline oxide accommodating buffer layer.

Each of the variations of compound semiconductor materials and monocrystalline oxide accommodating buffer layer uses an appropriate template for initiating the growth of the compound semiconductor layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a compound semiconductor material layer comprising indium gallium arsenide, indium aluminum arsenide, or indium phosphide.

Figure 9:
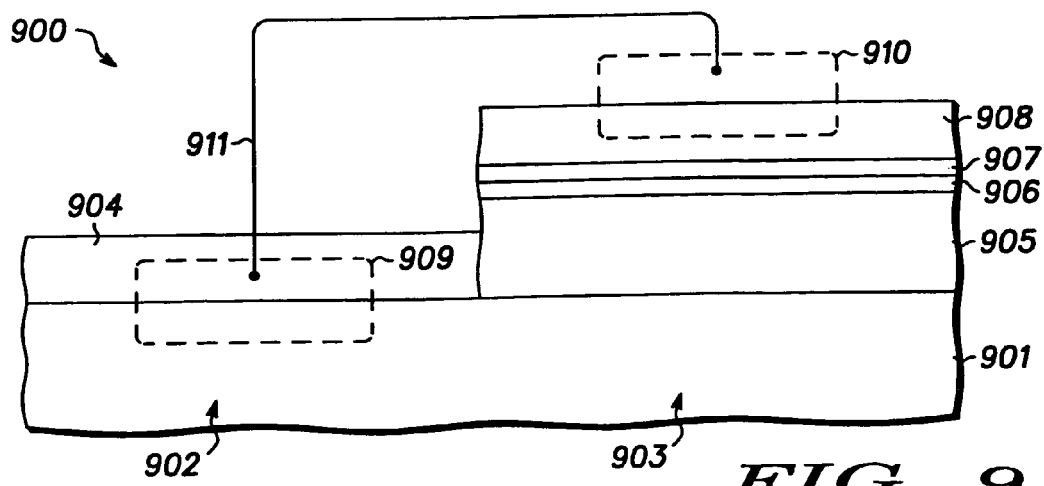
FIG. 9 illustrates schematically, in cross section, a monolithic integrated circuit in accordance with one embodiment of the invention.

FIG. 9 illustrates schematically, in cross section, a device structure 900 in accordance with a further embodiment of the invention. Device structure 900 includes a monocrystalline semiconductor substrate 901, preferably a monocrystalline silicon wafer. Monocrystalline semiconductor substrate 901 includes two regions, 902 and 903. An electrical semiconductor component generally indicated by the dashed line 909 is formed in region 902. Electrical component 909 can be a resistor, a capacitor, an active semiconductor component such as a diode or a transistor or an integrated circuit such as a MOS integrated circuit. For example, electrical component 909 can be a MOS circuit configured to perform digital signal processing or another function for which silicon integrated circuits are well suited. The electrical semiconductor component in region 902 can be formed by conventional semiconductor processing as well known and widely practiced in the semiconductor industry. A layer of insulating material 904 such as a layer of silicon dioxide or the like may overlie electrical semiconductor component 909.

Insulating material 904 and any other layers that may have been formed or deposited during the processing of semiconductor component 909 in region 902 are removed from the surface of region 903 to provide a bare substrate surface in that region, for example, a bare silicon surface. As is well known, bare silicon surfaces are highly reactive and a native silicon oxide layer can quickly form on the bare surface. A layer of barium or barium and oxygen may be deposited onto the native oxide layer on the surface of region 903 and then reacted with the oxidized surface to form a first template layer (not shown). In accordance with one embodiment of the invention, a monocrystalline oxide layer 906 is formed overlying the template layer by a process of molecular beam epitaxy. In one aspect of this exemplary embodiment, reactants including barium, titanium, and oxygen are deposited onto the template layer to form the monocrystalline oxide layer. Initially during the deposition, the partial pressure of oxygen is kept near the minimum necessary to fully react with the barium and titanium to form a monocrystalline barium titanate layer 906. The partial pressure of oxygen is then increased to provide an overpressure of oxygen and to allow oxygen to diffuse through the growing monocrystalline oxide layer. The oxygen diffusing through the barium titanate reacts with silicon at the surface of region 903 to form an amorphous layer 905 is silicon oxide on the second region and at the interface between the silicon substrate and the monocrystalline oxide.

In accordance with an embodiment of the invention, the step of depositing the monocrystalline oxide layer 906 is followed by depositing a second template layer (not shown), which can be 1–10 monolayers of titanium, barium, strontium, barium and oxygen, titanium and oxygen, or strontium and oxygen. A buffer layer 907 of a monocrystalline semiconductor material is then deposited overlying the second template layer by a process of molecular beam epitaxy. The deposition of buffer layer 907 may be initiated, for example, by depositing a layer of arsenic onto the template. This initial step is then followed by depositing gallium and arsenic to form monocrystalline gallium arsenide. Alternatively, strontium may be substituted for barium in the above example. Further, layer 907 may comprise any suitable monocrystalline semiconductor material, as described herein.

In accordance with one aspect of the present embodiment, after monocrystalline oxide layer 906 formation, the monocrystalline titanate layer and the silicon oxide layer, which is interposed between substrate 901 and the titanate layer, are exposed to an anneal process such that the titanate and oxide layers form an amorphous oxide layer 905. An additional compound semiconductor layer 908 is then epitaxially grown over layer 907, using the techniques described above in connection with layer 907. Alternatively, the above-described anneal process can be performed after formation of additional compound semiconductor layer 908.

In accordance with a further embodiment of the invention, a semiconductor component, generally indicated by a dashed line 910, is formed in compound semiconductor layer 908. Semiconductor component 910 can be formed by processing steps conventionally used in the fabrication of gallium arsenide or other III–V compound semiconductor material devices. Semiconductor component 910 may be any active or passive component, and preferably is a tunneling diode, light emitting diode, semiconductor laser, photodetector, heterojunction bipolar transistor (HBT), high frequency MESFET, or other component that utilizes and takes advantage of the physical properties of compound semiconductor materials. A metallic conductor schematically indicated by the line 911 can be formed to electrically couple device 910 and device 909, thus implementing an integrated device that includes at least one component formed in the silicon substrate and one device formed in the monocrystalline semiconductor material layer. Although illustrative structure 900 has been described as a structure formed on a silicon substrate 901 and having a barium (or strontium) titanate layer 906 and a gallium arsenide layer 908, similar devices can be fabricated using other monocrystalline substrates, monocrystalline oxide layers and other monocrystalline compound semiconductor layers as described elsewhere in this disclosure.

Figure 10:
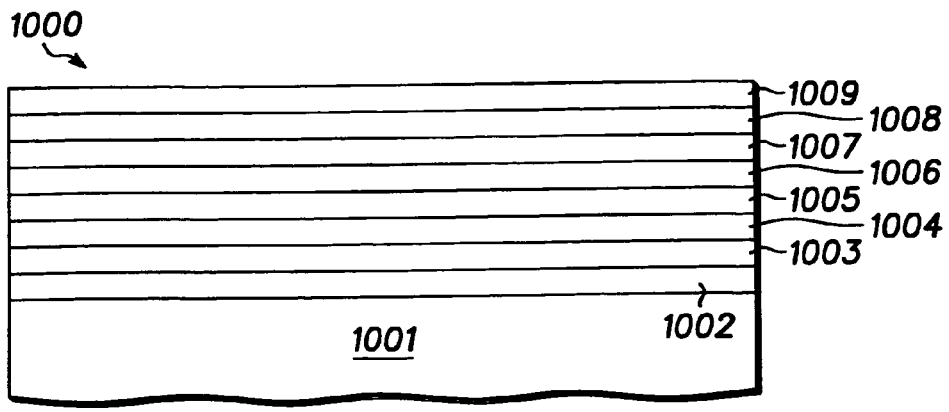
FIGS. 10–17 illustrate schematically, in cross section, device structures in accordance with further exemplary embodiments of the invention.

FIG. 10 illustrates a semiconductor structure 1000 in accordance with a further embodiment of the invention. In this embodiment, structure 1000 is a resonant interband tunnel diode formed of monocrystalline epitaxial layers of compound semiconductor material on a monocrystalline silicon substrate. Structure 1000 includes a monocrystalline semiconductor substrate 1001, such as a monocrystalline silicon wafer. An amorphous oxide layer 1002 is preferably formed overlying substrate 1001, in accordance with the process described above. An accommodating buffer layer 1003 is formed overlying substrate 1001 and amorphous oxide layer 1002. As described above, amorphous oxide layer 1002 may be grown at the interface between substrate 1001 and the growing accommodating buffer layer 1003 by the oxidation of substrate 1001 during the growing of layer 1003. Accommodating buffer layer 1003 is preferably a monocrystalline oxide or nitride material selected for its crystalline compatibility with the underlying substrate and with the overlying compound semiconductor material. In this embodiment, wherein substrate 1001 is monocrystalline silicon and the overlying compound semiconductor material layer is monocrystalline GaAs, layer 1003 may comprise, for example, an alkali earth metal titanate such as barium titanate or strontium titanate.

An additional buffer layer 1004 is preferably formed overlying layer 1003 to alleviate any strains that might result from a mismatch of the crystal lattice of accommodating buffer layer 1003 and the lattice of the monocrystalline semiconductor material layer. In this exemplary embodiment, buffer layer 1004 is a layer of GaAs and can have a thickness of about 500 to about 2000 nanometers (nm) and preferably a thickness of about 500 to about 1000 nm. The thickness generally depends on the application for which the layer is being prepared. To facilitate the epitaxial growth of the gallium arsenide on the monocrystalline oxide, a template layer (not shown) may be formed by capping the oxide layer. The template layer is preferably 1–10 monolayers of Ti—As, Sr—O—As, Sr—Ga—O, or Sr—Al—O.

In accordance with this embodiment of the invention, carrier supply layer 1005 is a layer of n+ doped GaAs having a thickness of about 500 nanometers (nm). A first quantum well layer 1006, a barrier layer 1007, and a second quantum well layer 1008 are epitaxially grown, in succession, on carrier supply layer 1005. In accordance with this embodiment of the invention, quantum well layers 1006 and 1008 are layers of indium gallium arsenide (InGaAs) having a thickness of about 4 to about 5 nanometers (nm). Barrier layer 1007 is a layer of GaAs having a thickness of about 2 to about 4 nanometers (nm). Quantum well layers 1006, 1008 and barrier layer 1007 are not intentionally doped. After formation of layers 1006, 1007, and 1008, a second carrier supply layer 1009 is grown on second quantum well layer 1008. In accordance with this embodiment of the invention, carrier supply layer 1009 is a layer of p+ doped GaAs having a thickness of about 50 nanometers (nm).

Figure 11:
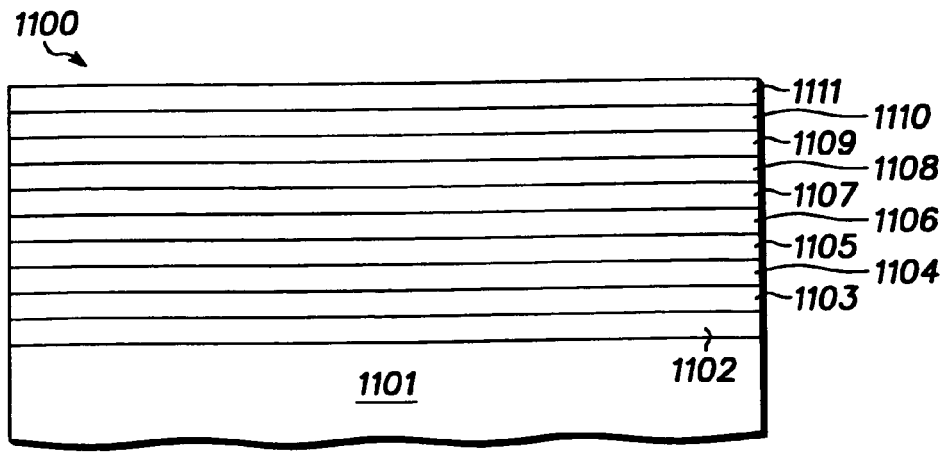

FIG. 11 illustrates a semiconductor structure 1100 in accordance with a further embodiment of the invention. In this embodiment, structure 1100 is a resonant interband tunnel diode formed of monocrystalline epitaxial layers of compound semiconductor material on a monocrystalline silicon substrate. Structure 1100 includes a monocrystalline semiconductor substrate 1101, such as a monocrystalline silicon wafer. An amorphous oxide layer 1102 is preferably formed overlying substrate 1101, in accordance with the process described above. An accommodating buffer layer 1103 is formed overlying substrate 1101 and amorphous oxide layer 1102. As described above, amorphous oxide layer 1102 may be grown at the interface between substrate 1101 and the growing accommodating buffer layer 1103 by the oxidation of substrate 1101 during the growing of layer 1103. Accommodating buffer layer 1103 is preferably a monocrystalline oxide or nitride material selected for its crystalline compatibility with the underlying substrate and with the overlying compound semiconductor material. In this embodiment, wherein substrate 1101 is monocrystalline silicon and the overlying compound semiconductor material layer is monocrystalline InP, layer 1103 may comprise, for example, an alkali earth metal zirconate such as strontium zirconate or barium zirconate, or an alkali earth metal hafnate such as strontium hafnate or barium hafnate.

An additional buffer layer 1104 is preferably formed overlying layer 1103 to alleviate any strains that might result from a mismatch of the crystal lattice of accommodating buffer layer 1103 and the lattice of the monocrystalline semiconductor material layer. In this exemplary embodiment, buffer layer 1104 is a layer of InP or indium aluminum arsenide (InAlAs) and can have a thickness of about 50 nanometers (nm). To facilitate the epitaxial growth of the InP or InAlAs on the monocrystalline oxide, a template layer (not shown) may be formed by capping the oxide layer. The template layer may be 1–10 monolayers of Zr—As, Hf—As, Zr—P, Hf—P, Sr—O—As, Sr—O—P, Ba—O—As, Ba—O—P, or In—Sr—O. For example, where layer 1103 is barium zirconate, the template layer may be 1–2 monolayers of zirconium followed by deposition of 1–2 monolayers of arsenic to form a Zr—As template.

In accordance with this embodiment of the invention, a first carrier supply layer having first and second layers 1105 and 1106 of doped monocrystalline semiconductor material is formed overlying buffer layer 1104. Layers 1105 and 1106 are n+ doped InGaAs having a thickness of about 50 to about 100 nanometers (nm) and n+ doped InAlAs having a thickness of about 50 to about 100 nm, respectively. If tunnel diode structure 1100 is later electrically coupled to a second semiconductor device, layer 1105 may serve as a contact layer for the electrical interconnects.

A first quantum well layer 1107, a barrier layer 1108, and a second quantum well layer 1109 are epitaxially grown, in succession, on carrier supply layer 1106. In accordance with this embodiment of the invention, quantum well layers 1107 and 1109 are layers of InGaAs having a thickness of about 4 nm. Barrier layer 1108 is a layer of InAlAs having a thickness of about 2 nm. Quantum well layers 1107, 1109 and barrier layer 1108 are not intentionally doped. After formation of layers 1107, 1108 and 1109, a second carrier supply layer having first and second layers 1110 and 1111 of doped monocrystalline semiconductor material is grown on second quantum well layer 1109. Layers 1110 and 1111 are p+ doped InAlAs having a thickness of about 50 to about 100 nanometers (nm) followed by a p+ doped InGaAs layer having a thickness of about 50 to about 100 nm. If tunnel diode structure 1100 is later electrically coupled to a second semiconductor device, layer 1111 may serve as a contact layer for the electrical interconnects.

Figure 12:
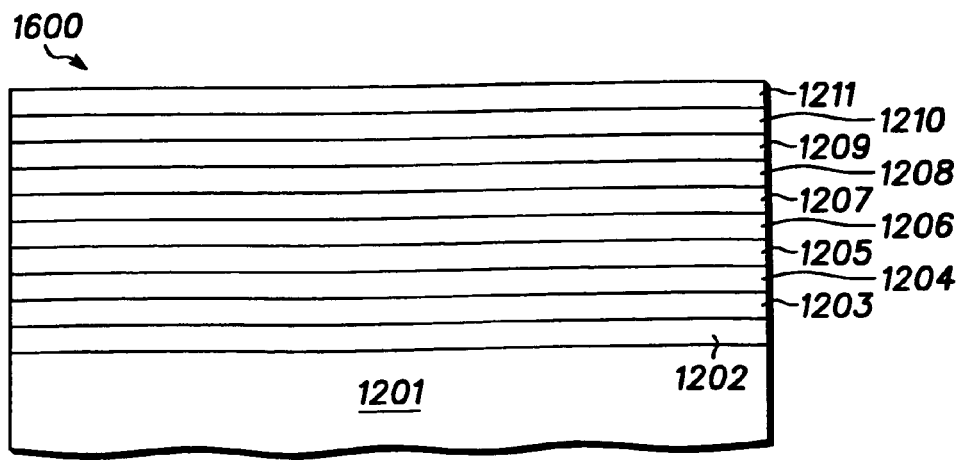

FIG. 12 illustrates a semiconductor structure 1200 in accordance with a further embodiment of the invention. In this embodiment, structure 1200 is a resonant intraband tunnel diode formed of monocrystalline epitaxial layers of compound semiconductor material on a monocrystalline silicon substrate. Structure 1200 includes a monocrystalline semiconductor substrate 1201, such as a monocrystalline silicon wafer. An amorphous oxide layer 1202 is preferably formed overlying substrate 1201, in accordance with the process described above. An accommodating buffer layer 1203 is formed overlying substrate 1201 and amorphous oxide layer 1202. As described above, amorphous oxide layer 1202 may be grown at the interface between substrate 1201 and the growing accommodating buffer layer 1203 by the oxidation of substrate 1201 during the growing of layer 1203. Accommodating buffer layer 1203 is preferably a monocrystalline oxide or nitride material selected for its crystalline compatibility with the underlying substrate and with the overlying compound semiconductor material. In this embodiment, wherein substrate 1201 is monocrystalline silicon and the overlying compound semiconductor material layer is monocrystalline GaAs, layer 1203 may comprise, for example, an alkali earth metal titanate such as barium titanate or strontium titanate.

An additional buffer layer 1204 is preferably formed overlying layer 1203 to alleviate any strains that might result from a mismatch of the crystal lattice of accommodating buffer layer 1203 and the lattice of the monocrystalline semiconductor material layer. In this exemplary embodiment, buffer layer 1204 is a layer of GaAs and can have a thickness of about 500 to about 2000 of about 50 to about 100 nanometers (nm) and preferably a thickness of about 500 to about 1000 nm. To facilitate the epitaxial growth of the gallium arsenide on the monocrystalline oxide, a template layer (not shown) may be formed by capping the oxide layer. The template layer is preferably 1–10 monolayers of Ti—As, Sr—O—As, Sr—Ga—O, or Sr—Al—O.

In accordance with a preferred embodiment of the invention, a first contact layer 1205 is formed on buffer layer 1204 and comprises a layer of n+ doped GaAs having a thickness of about 50 nm. A collection layer 1206 is then formed overlying contact layer 1205, and comprises a layer of n− doped GaAs having a thickness of about 50 nm.

Following formation of collection layer 1206, a first tunnel barrier layer 1207, a quantum well layer 1208, and a second tunnel barrier layer 1209 are epitaxially grown, in succession, on the collection layer. In accordance with this embodiment of the invention, tunnel barrier layers 1207 and 1209 are layers of aluminum gallium arsenide (AlGaAs) or aluminum arsenide (AlAs) having a thickness of about 5 nm. Quantum well layer 1208 is a layer of GaAs having a thickness of about 5 nm. Quantum well layer 1208 and tunnel barrier layers 1207 and 1209 are not intentionally doped. After formation of layers 1207, 1208, and 1209, an injection layer 1210 is grown on second tunnel barrier layer 1209. In accordance with this embodiment of the invention, injection layer 1210 is a spacer layer of n⁻ doped GaAs having a thickness of about 50 nm. In accordance with a preferred embodiment of the invention, a second contact layer 1211 is formed on injection layer 1210 and comprises a layer of n+ doped GaAs having a thickness of about 50 nm.

Figure 13:
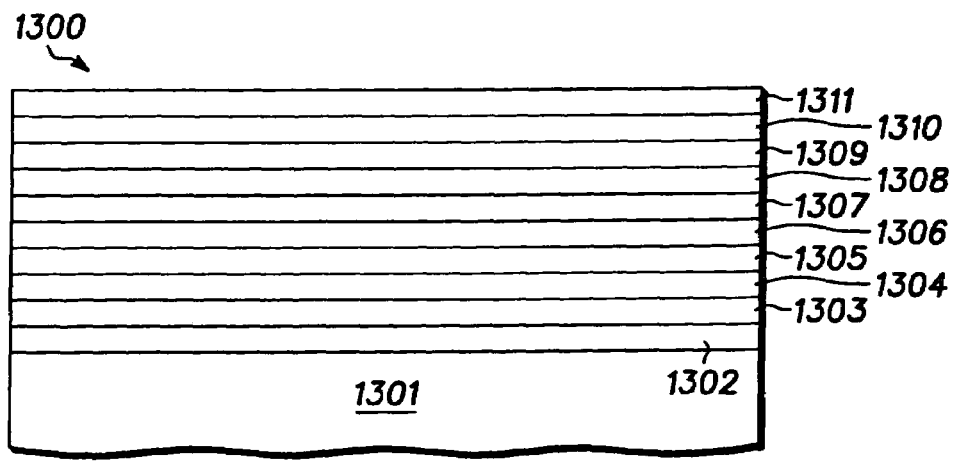

FIG. 13 illustrates a semiconductor structure 1300 in accordance with a further embodiment of the invention. In this embodiment, structure 1300 is a resonant intraband tunnel diode formed of monocrystalline epitaxial layers of compound semiconductor material on a monocrystalline silicon substrate. Structure 1300 includes a monocrystalline semiconductor substrate 1301, such as a monocrystalline silicon wafer. An amorphous oxide layer 1302 is preferably formed overlying substrate 1301, in accordance with the process described above. An accommodating buffer layer 1303 is formed overlying substrate 1301 and amorphous oxide layer 1302. As described above, amorphous oxide layer 1302 may be grown at the interface between substrate 1301 and the growing accommodating buffer layer 1303 by the oxidation of substrate 1301 during the growing of layer 1303. Accommodating buffer layer 1303 is preferably a monocrystalline oxide or nitride material selected for its crystalline compatibility with the underlying substrate and with the overlying compound semiconductor material. In this embodiment, wherein substrate 1301 is monocrystalline silicon and the overlying compound semiconductor material layer is monocrystalline InP, layer 1303 may comprise, for example, an alkali earth metal zirconate such as strontium zirconate or barium zirconate, or an alkali earth metal hafnate such as strontium hafnate or barium hafnate.

An additional buffer layer 1304 is preferably formed overlying layer 1303 to alleviate any strains that might result from a mismatch of the crystal lattice of accommodating buffer layer 1303 and the lattice of the monocrystalline semiconductor material layer. In this exemplary embodiment, buffer layer 1304 is a layer of InP or InAlAs and can have a thickness of about 500 to about 2000 nanometers (nm) and preferably a thickness of about 500 to about 1000 nm. To facilitate the epitaxial growth of the InP or InAlAs on the monocrystalline oxide, a template layer (not shown) may be formed by capping the oxide layer. The template layer may be 1–10 monolayers of Zr—As, Hf—As, Zr—P, Hf—P, Sr—O—As, Sr—O—P, Ba—O—As, Ba—O—P, or In—Sr—O. For example, where layer 1303 is barium zirconate, the template layer may be 1–2 monolayers of zirconium followed by deposition of 1–2 monolayers of arsenic to form a Zr—As template.

In accordance with a preferred embodiment of the invention, a first contact layer 1305 is formed on buffer layer 1304 and comprises a layer of n+ doped InGaAs having a thickness of about 50 nm. A spacer layer 1306 is then formed overlying contact layer 1305, and comprises a layer of InGaAs having a thickness of about 50 nm.

Following formation of spacer layer 1306, a first tunnel barrier layer 1307, a quantum well layer 1308, and a second tunnel barrier layer 1309 are epitaxially grown, in succession, on the spacer layer. In accordance with this embodiment of the invention, tunnel barrier layers 1307 and 1309 are layers of AlAs or InAlAs having a thickness of about 5 nm. Quantum well layer 1308 is a layer of InGaAs having a thickness of about 5 nm. Quantum well layer 1308 and tunnel barrier layers 1307 and 1309 are not intentionally doped. After formation of layers 1307, 1308, and 1309, a spacer layer 1310 is grown on second tunnel barrier layer 1309. In accordance with this embodiment of the invention, spacer layer 1310 is a layer of n− InGaAs having a thickness of about 5 nm. Preferably, injection layer 1310 is not intentionally doped. In accordance with a preferred embodiment of the invention, a contact layer 1311 is formed overlying injection layer 1310 and comprises n+ doped InGaAs having a thickness of about 50 nm.

Figure 14:
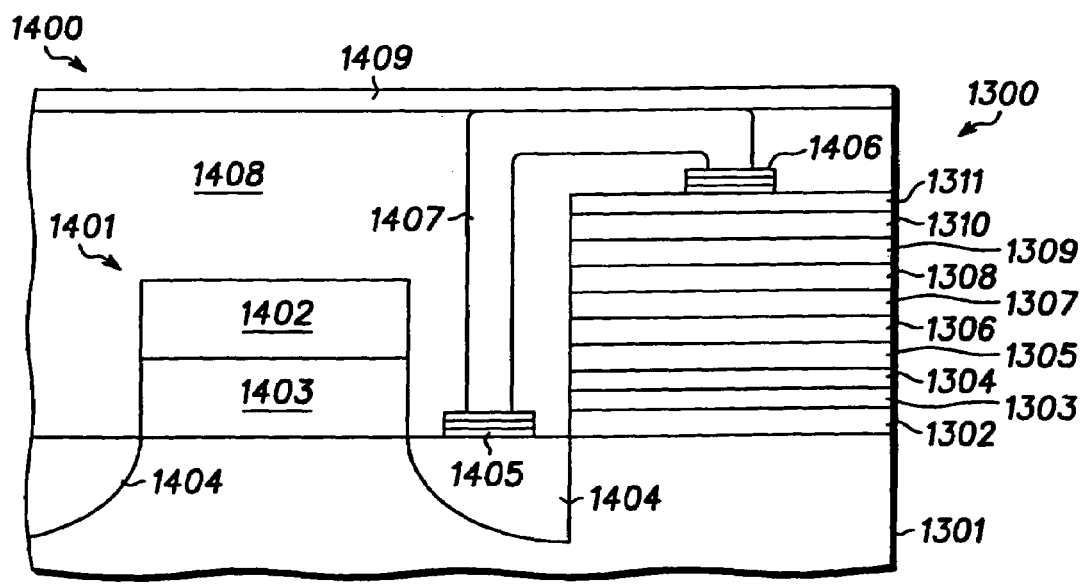

Referring now to FIG. 14, a monolithic integrated circuit is provided in accordance with one embodiment of the present invention. Monolithic integrated circuit 1400 generally includes a MOS circuit 1401 electrically coupled to a tunnel diode. In FIG. 14, for illustration purposes only, and without limitation, MOS circuit 1401 is electrically coupled to an intraband tunnel diode 1300, such as that exhibited in FIG. 13. Composite layers 1302 through 1311, as presented in FIG. 14, are identical to those illustrated and described above with reference to FIG. 13. In this embodiment, semiconductor substrate 1301 is a monocrystalline silicon substrate, such as a silicon wafer.

In accordance with the present embodiment of the invention, MOS circuit 1401 is first formed in semiconductor substrate 1301 using conventional processing steps and techniques well known to those skilled in the art. MOS circuit 1401 generally comprises a gate electrode 1402, a gate dielectric layer 1403, and n+ doped regions 1404. Gate dielectric layer 1403 is formed over a portion of substrate 1301, and gate electrode 1402 is then formed over gate dielectric layer 1403. Selective n-type doping is performed to form n+ doped regions 1404 within substrate 1301 along adjacent sides of gate electrode 1402 and are source, drain, or source/drain regions for the MOS transistor. The n+ doped regions 1404 have a doping concentration of at least about 1E19 atoms per cubic centimeter to allow one or more ohmic contacts to be formed. In this embodiment, n+ doped region 1404 is a drain region for the MOS transistor. After formation of MOS portion 1401 of the integrated circuit, all of the layers formed during processing are removed from the surface of substrate 1301 in the region where tunnel diode 1300 will be formed. A bare silicon surface is thus provided for the subsequent processing of tunnel diode 1300, for example in the manner set forth above.

After formation of both MOS circuit 1401 and tunnel diode 1300 on substrate 1301, processing continues to form a substantially completed integrated circuit 1400. Ohmic contacts 1405 and 1406 may be formed on drain region 1404 and contact layer 1312, respectively, using standard processing techniques well known in the art. An insulating layer 1408 is formed over substrate 1301, MOS circuit 1401, and tunnel diode 1300. Portions of insulating layer 1408 are then removed to define contact openings where the devices are to be interconnected. Interconnect trenches are formed within insulating layer 1408 to provide the lateral connections between the contacts. As illustrated in FIG. 14, interconnect 1407 connects a drain region of the MOS circuit to the uppermost contact layer 1312 of tunnel diode 1300. A passivation layer 1409 is formed over the interconnect 1407 and insulating layer 1408. Other electrical connections may be made to the devices and/or other electrical or electronic components within the integrated circuit 1400 but not illustrated in the figure according to conventional techniques available to those skilled in the art.

Figure 15:
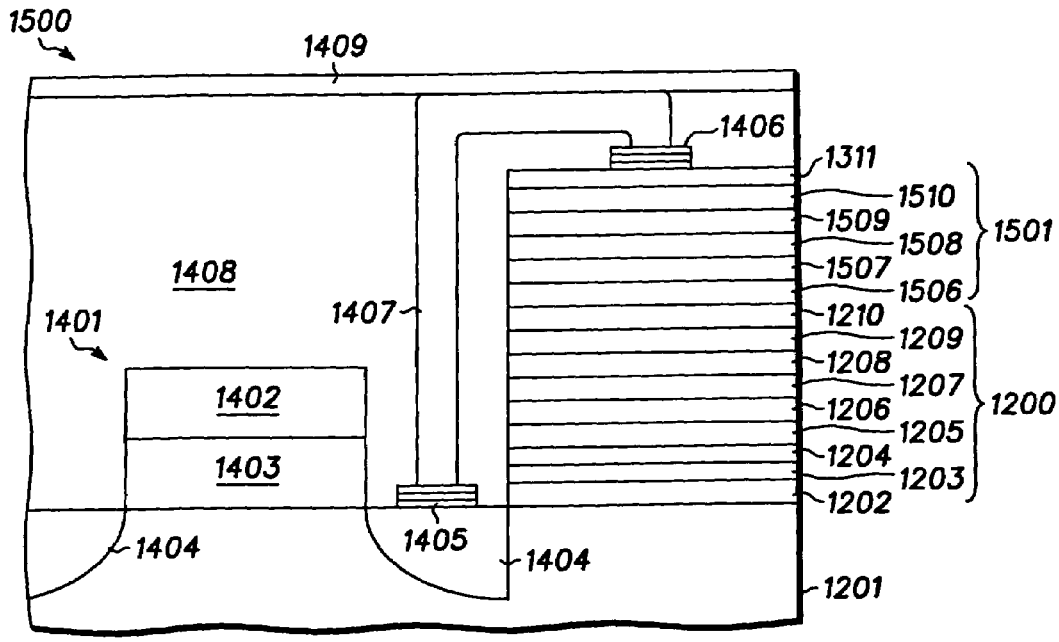

Referring now to FIG. 15, a monolithic integrated circuit is provided in accordance with one embodiment of the present invention. Monolithic integrated circuit 1500 generally includes a MOS circuit 1401 electrically coupled in series to first and second tunnel diodes. In FIG. 15, for illustration purposes only, and without limitation, MOS circuit 1401 is electrically coupled to first and second intraband tunnel diodes 1200 and 1501 of the type illustrated and described with reference to FIG. 12. Composite layers 1202 through 1210, as presented in FIG. 15, are identical to those illustrated and described above with reference to FIG. 12. In this embodiment, semiconductor substrate 1201 is a monocrystalline silicon substrate, such as a silicon wafer.

In accordance with the present embodiment of the invention, MOS circuit 1401 is first formed in semiconductor substrate 1301 using conventional processing steps and techniques well known to those skilled in the art, in accordance with the above description in reference to FIG. 14. First tunnel diode 1200 is formed in accordance with FIG. 12 and its accompanying description, except that second contact layer 1211 is omitted, leaving injection layer 1210 as the top layer of first tunnel diode 1200.

Second tunnel diode 1501 is formed overlying injection layer 1210 of first tunnel diode 1200, beginning with formation of a collection layer 1506. In the present embodiment of the invention, collection layer 1506 is a layer of n-doped GaAs. Following formation of collection layer 1506, a first tunnel barrier layer 1507, a quantum well layer 1508, and a second tunnel barrier layer 1509 are grown, in succession, on the collection layer. In accordance with this embodiment of the invention, tunnel barrier layers 1507 and 1509 are layers of AlGaAs or AlAs. Quantum well layer 1508 is a layer of GaAs. Quantum well layer 1508 and tunnel barrier layers 1507 and 1509 are not intentionally doped. After formation of layers 1507, 1508, and 1509, a spacer layer 1510 comprising n⁻ doped GaAs is grown on second tunnel barrier layer 1509. Finally, a contact layer 1511 is formed on spacer layer 1510 and comprises a layer of n+ doped GaAs.

As detailed with reference to FIG. 14, after formation of both MOS circuit 1401 and tunnel diodes. 1200 and 1501 on substrate 1301, processing continues to form a substantially completed integrated circuit 1500. Ohmic contacts 1405 and 1406 may be formed on drain region 1404 and contact layer 1512, respectively. An insulating layer 1408 is formed over substrate 1301, MOS circuit 1401, and tunnel diodes 1200 and 1501. Portions of insulating layer 1408 are then removed to define contact openings where the devices are to be interconnected. Interconnect trenches are formed within insulating layer 1408 to provide the lateral connections between the contacts. As illustrated in FIG. 15, interconnect 1407 connects a drain region of the MOS circuit to the uppermost contact layer 1512 of tunnel diode 1501. A passivation layer 1409 is formed over the interconnect 1407 and insulating layer 1408. Other electrical connections may be made to the devices and/or other electrical or electronic components within the integrated circuit 1500 (not illustrated in the figure) according to conventional techniques available to those skilled in the art.

Figure 16:
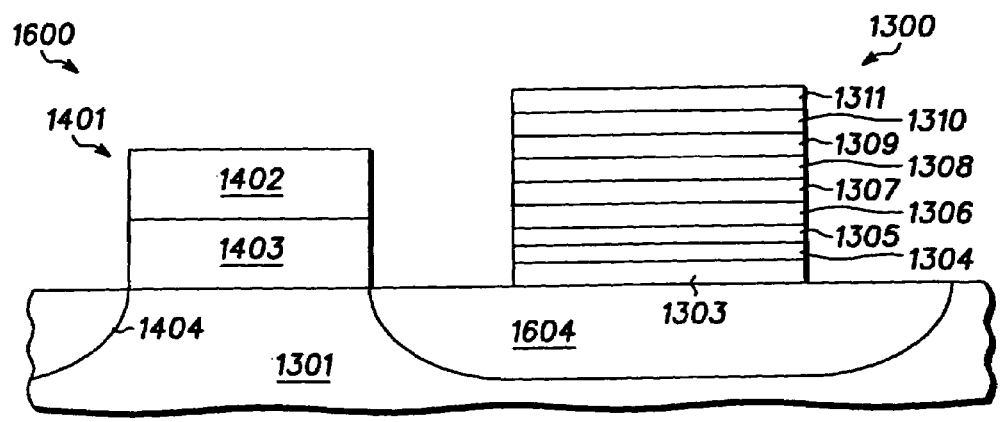

Referring now to FIG. 16, a monolithic integrated circuit is provided in accordance with one embodiment of the present invention. Monolithic integrated circuit 1600 generally includes a MOS circuit 1401 having a drain region 1604 and a tunnel diode 1300 formed overlying and electrically coupled to the drain region. In FIG. 16, for illustration purposes only, and without limitation, MOS circuit 1401 is electrically coupled to an intraband tunnel diode 1300 of the type illustrated and described with reference to FIG. 13. Composite layers 1303 through 1311, as presented in FIG. 16, are identical to those illustrated and described above with reference to FIG. 13. In this embodiment, semiconductor substrate 1301 is a monocrystalline silicon substrate, such as a silicon wafer.

In this embodiment, no amorphous layer is formed between substrate 1301 and monocrystalline layer 1303. Rather, monocrystalline oxide layer 1303 is formed overlying drain region 1604 and is selectively doped to render the oxide electrically conductive. Intraband tunnel diode 1300 is then formed in accordance with the above description in electrical contact with the electrically conductive oxide of layer 1303.

Figure 17:
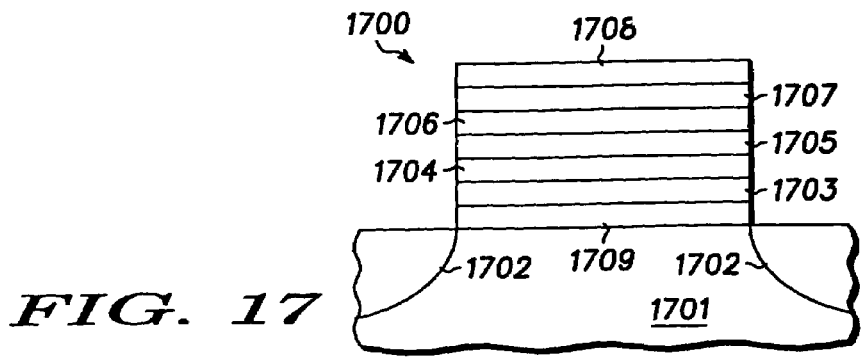

In FIG. 17, a monolithic integrated circuit 1700 generally includes a MOS transistor having a gate electrode and a tunnel diode formed overlying and electrically coupled to the gate electrode. In FIG. 17, for illustration purposes only, and without limitation, an interband tunnel diode generally of the type illustrated and described with reference to FIG. 10 is formed overlying the gate electrode of the MOS transistor. In this embodiment, semiconductor substrate 1701 is a monocrystalline silicon substrate, such as a silicon wafer. N+ doped regions 1702 represent the source, drain, or source/drain regions of the MOS transistor, and are formed via ion implantation in substrate 1701.

An amorphous oxide layer 1709 is preferably formed overlying substrate 1701, in accordance with the process described above. In accordance with this embodiment of the present invention, a monocrystalline oxide layer 1703 is formed overlying amorphous layer 1709. Gate electrode 1704 is then formed overlying monocrystalline oxide layer 1703 in accordance with the above-described techniques. In this embodiment, gate electrode 1704 is a layer of n+ doped GaAs and can have a thickness of about 50 to about 500 nanometers (nm) and preferably a thickness of about 50 to about 100 nm.

A first quantum well layer 1705, a barrier layer 1706, and a second quantum well layer 1707 are grown, in succession, on gate electrode 1704. In accordance with this embodiment of the invention, quantum well layers 1705 and 1707 are InGaAs and barrier layer 1706 is GaAs, none of which are intentionally doped. After formation of layers 1705, 1706, and 1707, a p+ doped GaAs carrier supply layer 1708 is epitaxially grown on second quantum well layer 1707.

Clearly, these embodiments of integrated circuits having compound semiconductor portions and Group IV semiconductor portions are meant to illustrate embodiments of the present invention and do not limit the present invention. There are a multiplicity of other combinations of semiconductor devices and other embodiments of the present invention that come within the present disclosure. For example, the compound semiconductor portion may include light emitting diodes, photodetectors, diodes, or the like, and the Group IV semiconductor portions can include digital logic, memory arrays, and most structures that can be formed in conventional MOS integrated circuits. By using embodiments of the present invention, it is now simpler to integrate devices that work better in compound semiconductor materials with other components that work better or are easily and/or inexpensively formed within Group IV semiconductor materials. This allows the device size to decrease, the manufacturing costs to decrease, and yield and reliability to increase.

As contemplated in the above description, a monocrystalline Group IV wafer can also be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within II–V or II–IV semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material Fabrication costs for compound semiconductor devices should decrease because larger substrates can be processed more economically and more readily compared to relatively smaller and more fragile conventional compound semiconductor wafers.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. For example, use of Sb-based materials, such as indium antimonide (InSb), aluminum antimonide (AlSb), indium aluminum antimonide (InAlSb), gallium antimonide (GaSb), indium gallium antimonide (InGaSb), and aluminum gallium antimonide (InGaSb), is possible in accordance with the present invention. As those skilled in the art will appreciate, the present invention may be applicable to any heterojunction interband tunnel diode, resonant tunnel diode, or other tunnel diode structures in any III–V or compound semiconductor that can lattice-matched to silicon using a perovskite or other appropriate oxide.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features of elements of any or all the claims. As used herein, the terms "comprises," "comprising," or any other variation thereof, are intended to cover a non-exclusive inclusion, such that a process, method, article, or apparatus that comprises a list of elements does not expressly listed or inherent to such process, method, article, or apparatus.

The invention claimed is:

1. A monolithic integrated circuit comprising:
    an MOS circuit formed at least partially in a monocrystalline substrate;
    a monocrystalline compound semiconductor layer overlying the monocrystalline substrate; and
    a tunnel diode formed at least partially in the monocrystalline compound semiconductor layer, the tunnel diode electrically coupled to the MOS circuit.

2. The monolithic integrated circuit of claim 1 wherein the MOS circuit comprises an MOS transistor having a drain region and the tunnel diode is electrically coupled to the drain region.

3. The monolithic integrated circuit of claim 2 further comprising a second tunnel diode coupled to the drain region in series with the tunnel diode.

4. The monolithic integrated circuit of claim 1 wherein the MOS circuit comprises an MOS transistor having a drain region and the tunnel diode is formed overlying and electrically coupled to the drain region.

5. The monolithic integrated circuit of claim 1 wherein the MOS circuit comprises an MOS transistor having a gate electrode and the tunnel diode is formed overlying and electrically coupled to the gate electrode.

6. The monolithic integrated circuit of claim 1 wherein the MOS circuit comprises a digital circuit.

7. The monolithic integrated circuit of claim 1 wherein the tunnel diode comprises an interband tunnel diode.

8. The monolithic integrated circuit of claim 1 wherein the tunnel diode comprises an intraband tunnel diode.

* * * * *